US 8,512,879 B2

(12) United States Patent
Ye et al.

(10) Patent No.: US 8,512,879 B2
(45) Date of Patent: *Aug. 20, 2013

(54) POLYMER FOR OPTOELECTRONIC DEVICE

(75) Inventors: Qing Ye, Los Gatos, CA (US); Jie Lu, Niskayuna, NY (US); Kelly Scott Chichak, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 621 days.

This patent is subject to a terminal disclaimer.

(21) Appl. No.: 12/615,748

(22) Filed: Nov. 10, 2009

(65) Prior Publication Data

US 2011/0108807 A1    May 12, 2011

(51) Int. Cl.
*H01L 51/54* (2006.01)
*C09K 11/06* (2006.01)

(52) U.S. Cl.
USPC ........... 428/690; 428/917; 313/504; 313/506; 252/301.16; 257/40; 257/103; 257/E51.027; 257/E51.032; 257/E51.044; 548/530; 528/9; 526/241; 526/258

(58) Field of Classification Search
None
See application file for complete search history.

(56) References Cited

U.S. PATENT DOCUMENTS

| | | | |
|---|---|---|---|
| 4,769,292 A * | 9/1988 | Tang et al. ................ | 428/690 |
| 6,204,515 B1 | 3/2001 | Bernius et al. | |
| 6,353,083 B1 * | 3/2002 | Inbasekaran et al. ......... | 528/295 |
| 2002/0193532 A1 * | 12/2002 | Ikehira et al. ............... | 525/333.3 |
| 2004/0127666 A1 | 7/2004 | Inbasekaran et al. | |
| 2005/0014023 A1 * | 1/2005 | Yu et al. ...................... | 428/690 |
| 2007/0225464 A1 | 9/2007 | Lewis et al. | |
| 2008/0026477 A1 | 1/2008 | Cella et al. | |

FOREIGN PATENT DOCUMENTS

| | | |
|---|---|---|
| WO | WO2008014037 A2 | 1/2008 |
| WO | WO2009079039 A1 | 6/2009 |

OTHER PUBLICATIONS

PCT International Search Report dated Jan. 13, 2011 and Written Opinion.

* cited by examiner

*Primary Examiner* — Michael H Wilson
(74) *Attorney, Agent, or Firm* — Mary Louise Stanford

(57) ABSTRACT

A polymer useful in an optoelectronic device comprises structural unit of formula I:

wherein
$R^1$ is, independently at each occurrence, a $C_1$-$C_{20}$ aliphatic radical, a $C_3$-$C_{20}$ aromatic radical, or a $C_3$-$C_{20}$ cycloaliphatic radical;
a is, independently at each occurrence, an integer ranging from 0-4;
$Ar^1$ is aryl or heteroaryl;
$Ar^2$ is fluorene;
$R^2$ is alkylene, substituted alkylene, oxaalkylene, CO, or $CO_2$;
$R^3$, $R^4$ and $R^5$ are independently hydrogen, alkyl, alkoxy, alkylaryl, aryl, arylalkyl, heteroaryl, substituted alkyl; substituted alkoxy, substituted alkylaryl, substituted aryl, substituted arylalkyl, or substituted heteroaryl; and
L is derived from phenylpyridine, tolylpyridine, benzothienylpyridine, phenylisoquinoline, dibenzoquinozaline, fluorenylpyridine, ketopyrrole, 2-(1-naphthyl)benzoxazole)), 2-phenylbenzoxazole, 2 phenylbenzothiazole, coumarin, thienylpyridine, phenylpyridine, benzothienylpyridine, 3 methoxy-2-phenylpyridine, thienylpyridine, phenylimine, vinylpyridine, pyridylnaphthalene, pyridylpyrrole, pyridylimidazole, phenylindole, derivatives thereof or combinations thereof.

20 Claims, No Drawings

POLYMER FOR OPTOELECTRONIC DEVICE

BACKGROUND

The invention relates generally to polymers useful, e.g., in light emissive layers of optoelectronic devices, and the optoelectronic devices comprising the polymers.

Optoelectronic devices, e.g. Organic Light Emitting Devices (OLEDs), which make use of thin film materials that emit light when subjected to a voltage bias, are expected to become an increasingly popular form of flat panel display technology. This is because OLEDs have a wide variety of potential applications, including cell phones, personal digital assistants (PDAs), computer displays, informational displays in vehicles, television monitors, as well as light sources for general illumination. Due to their bright colors, wide viewing angle, compatibility with full motion video, broad temperature ranges, thin and conformable form factor, low power requirements and the potential for low cost manufacturing processes, OLEDs are seen as a future replacement technology for cathode ray tubes (CRTs) and liquid crystal displays (LCDs). Due to their high luminous efficiencies, OLEDs are seen as having the potential to replace incandescent, and perhaps even fluorescent, lamps for certain types of applications.

OLEDs possess a sandwiched structure, which consists of one or more organic layers between two opposite electrodes. For instance, multi-layered devices usually comprise at least three layers: a hole injection/transport layer, an emissive layer and an electron transport layer (ETL). Furthermore, it is also preferred that the hole injection/transport layer serves as an electron blocking layer and the ETL as a hole blocking layer. Single-layered OLEDs comprise only one layer of materials between two opposite electrodes.

BRIEF DESCRIPTION

In one aspect, the invention relates to a polymer comprising structural unit of formula I:

wherein $R^1$ is, independently at each occurrence, a $C_1$-$C_{20}$ aliphatic radical, a $C_3$-$C_{20}$ aromatic radical, or a $C_3$-$C_{20}$ cycloaliphatic radical;

a is, independently at each occurrence, an integer ranging from 0-4;

$Ar^1$ is aryl or heteroaryl;

$Ar^2$ is fluorene;

$R^2$ is alkylene, substituted alkylene, oxaalkylene, CO, or $CO_2$;

$R^3$, $R^4$ and $R^5$ are independently hydrogen, alkyl, alkoxy, alkylaryl, aryl, arylalkyl, heteroaryl, substituted alkyl; substituted alkoxy, substituted alkylaryl, substituted aryl, substituted arylalkyl, or substituted heteroaryl; and L is derived from phenylpyridine, tolylpyridine, benzothienylpyridine, phenylisoquinoline, dibenzoquinozaline, fluorenylpyridine, ketopyrrole, 2-(1-naphthyl)benzoxazole)), 2-phenylbenzoxazole, 2 phenylbenzothiazole, coumarin, thienylpyridine, phenylpyridine, benzothienylpyridine, 3 methoxy-2-phenylpyridine, thienylpyridine, phenylimine, vinylpyridine, pyridylnaphthalene, pyridylpyrrole, pyridylimidazole, phenylindole, derivatives thereof or combinations thereof.

In another aspect, the invention relates to an optoelectronic device comprising the above polymer.

DETAILED DESCRIPTION

In one aspect, the invention relates to a polymer comprising structural unit of formula I:

I

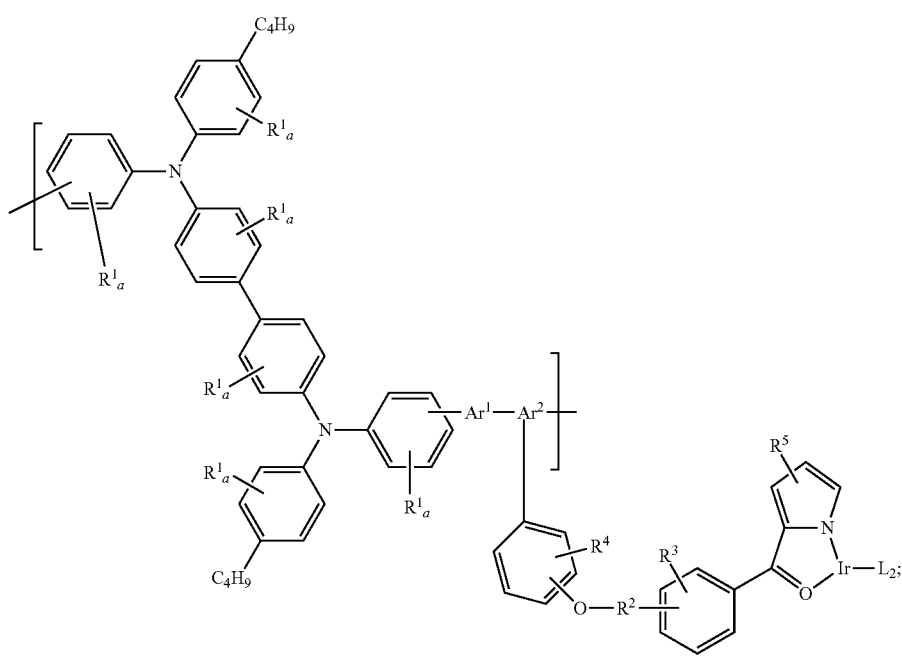

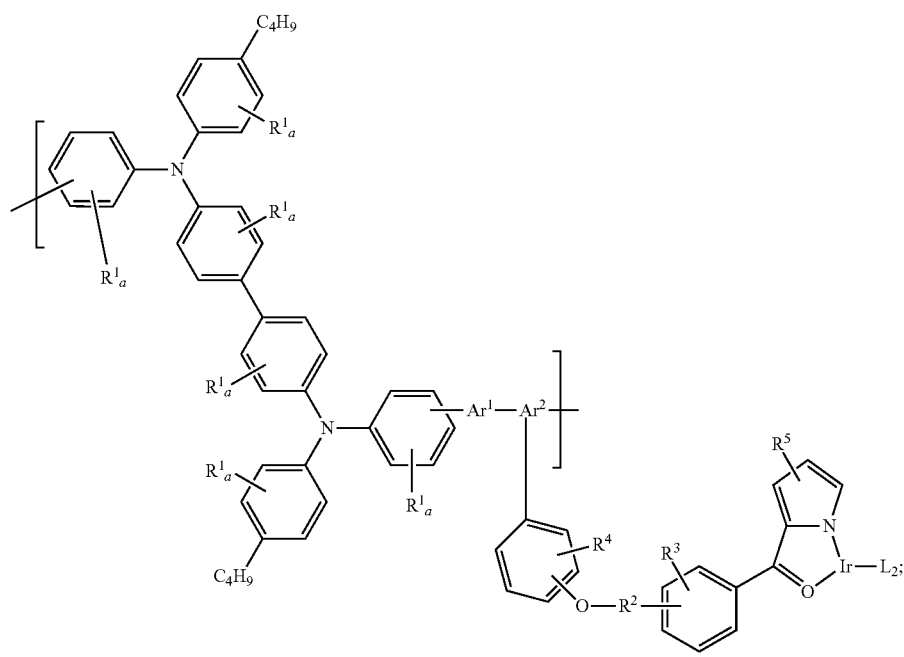

wherein

R¹ is, independently at each occurrence, a $C_1$-$C_{20}$ aliphatic radical, a $C_3$-$C_{20}$ aromatic radical, or a $C_3$-$C_{20}$ cycloaliphatic radical;

a is, independently at each occurrence, an integer ranging from 0-4;

$Ar^1$ is aryl or heteroaryl;

$Ar^2$ is fluorene;

$R^2$ is alkylene, substituted alkylene, oxaalkylene, CO, or $CO_2$;

$R^3$, $R^4$ and $R^5$ independently hydrogen, alkyl, alkoxy, alkylaryl, aryl, arylalkyl, heteroaryl, substituted alkyl; substituted alkoxy, substituted alkylaryl, substituted aryl, substituted arylalkyl, or substituted heteroaryl; and L is derived from phenylpyridine, tolylpyridine, benzothienylpyridine, phenylisoquinoline, dibenzoquinozaline, fluorenylpyridine, ketopyrrole, 2-(1-naphthyl)benzoxazole)), 2-phenylbenzoxazole, 2 phenylbenzothiazole, coumarin, thienylpyridine, phenylpyridine, benzothienylpyridine, 3 methoxy-2-phenylpyridine, thienylpyridine, phenylimine, vinylpyridine, pyridylnaphthalene, pyridylpyrrole, pyridylimidazole, phenylindole, derivatives thereof or combinations thereof.

In another aspect, the invention relates to an optoelectronic device comprising the above polymer.

In some embodiments, $Ar^1$ is selected from

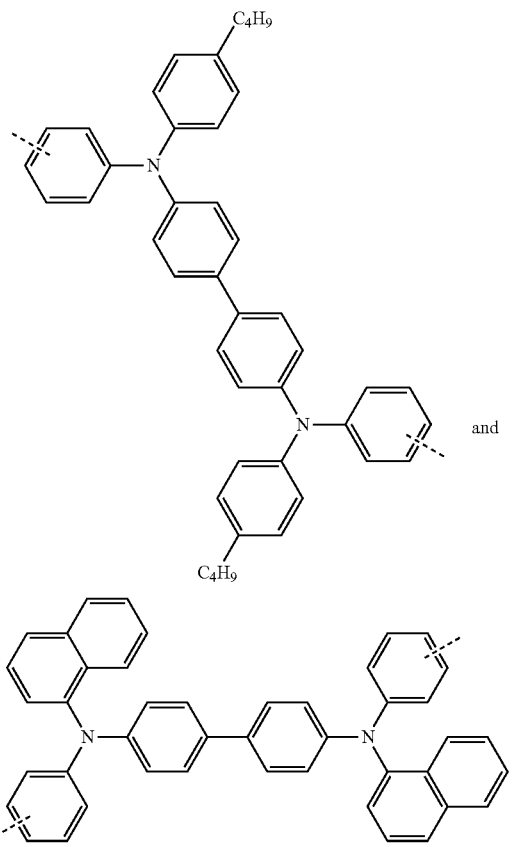

In some embodiments, L is derived from phenylisoquinoline.

In some embodiments, the polymer comprises structural unit of formula II
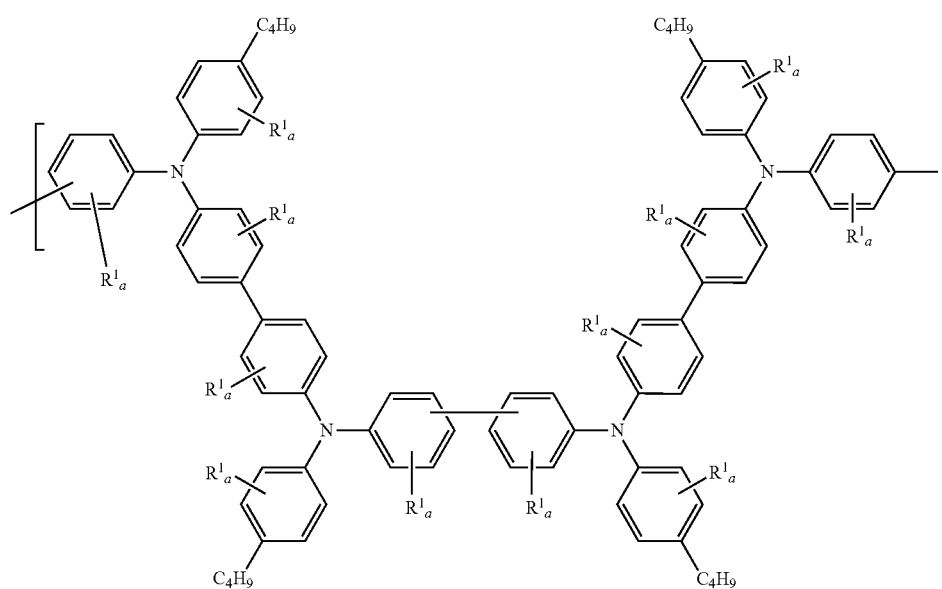
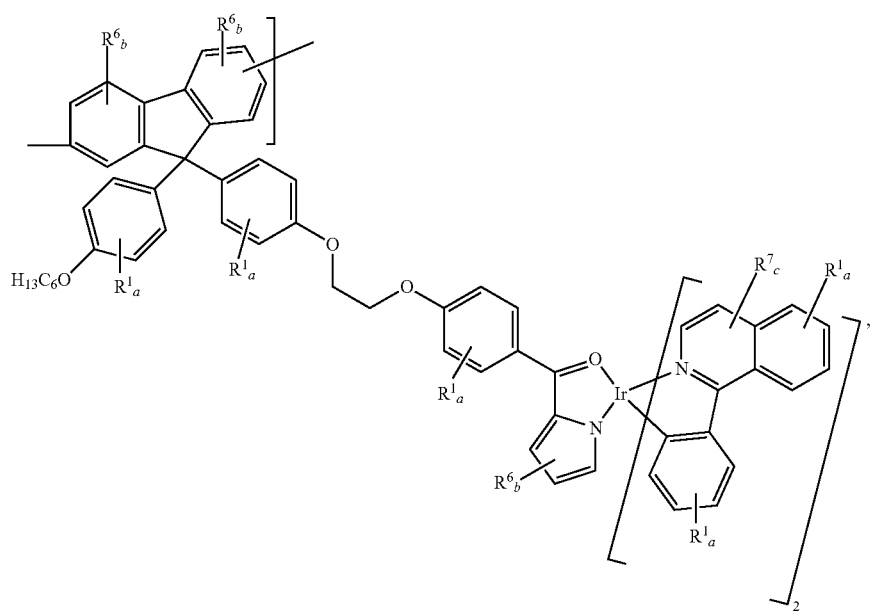
wherein
$R^6$ and $R^7$ are, independently at each occurrence, a $C_1$-$C_{20}$ aliphatic radical, a $C_3$-$C_{20}$ aromatic radical, or a $C_3$-$C_{20}$ cycloaliphatic radical;
b, independently at each occurrence, an integer ranging from 0-3; and
c, independently at each occurrence, an integer ranging from 0-2.

In some embodiments, the polymer comprises structural units of formula III
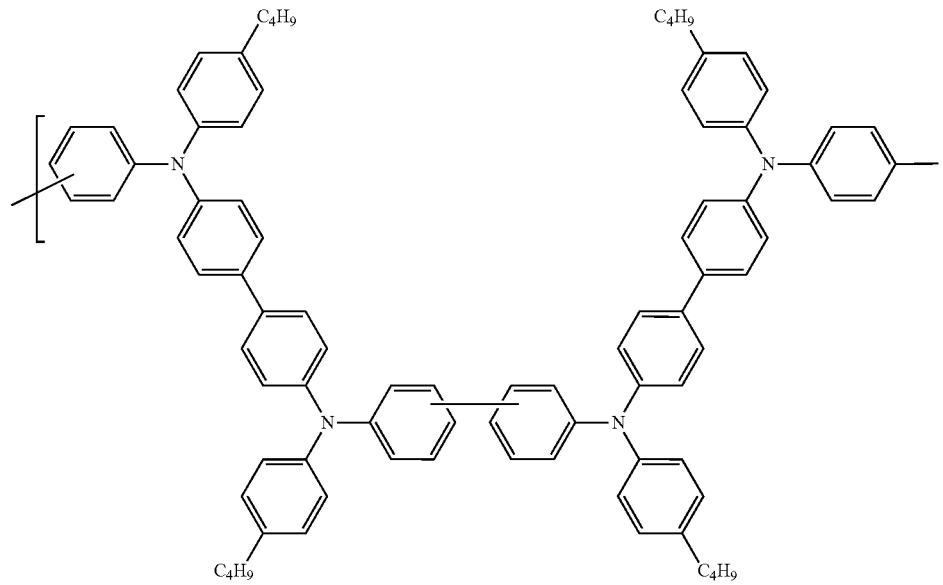
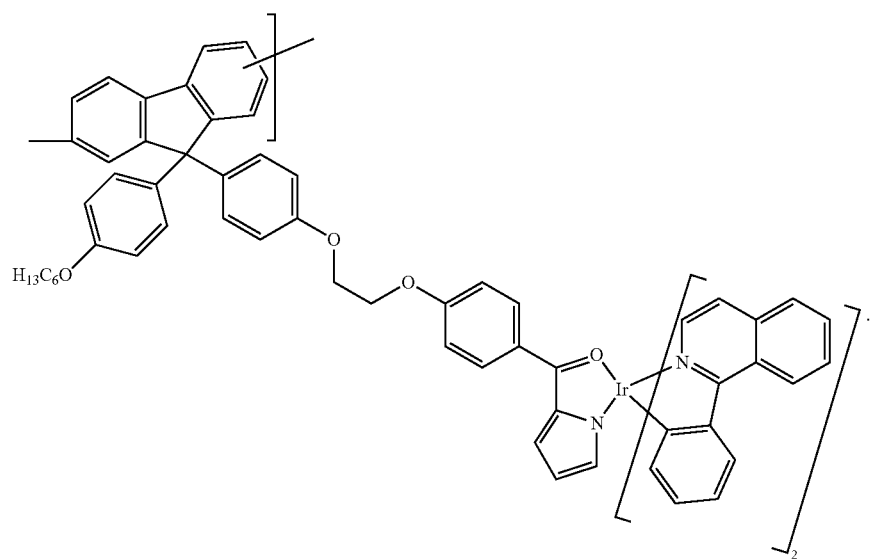

In some embodiments, the polymer comprises structural units of formula IV
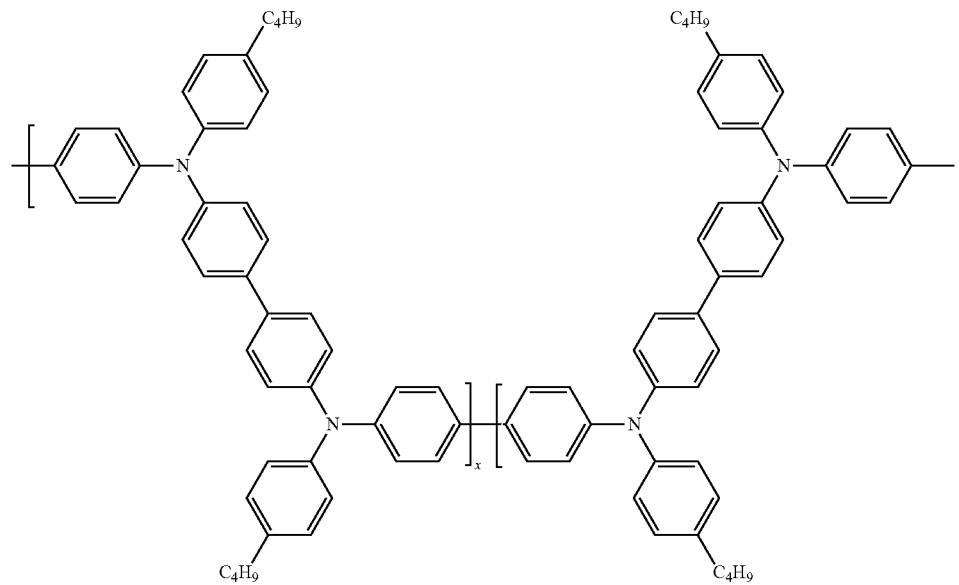
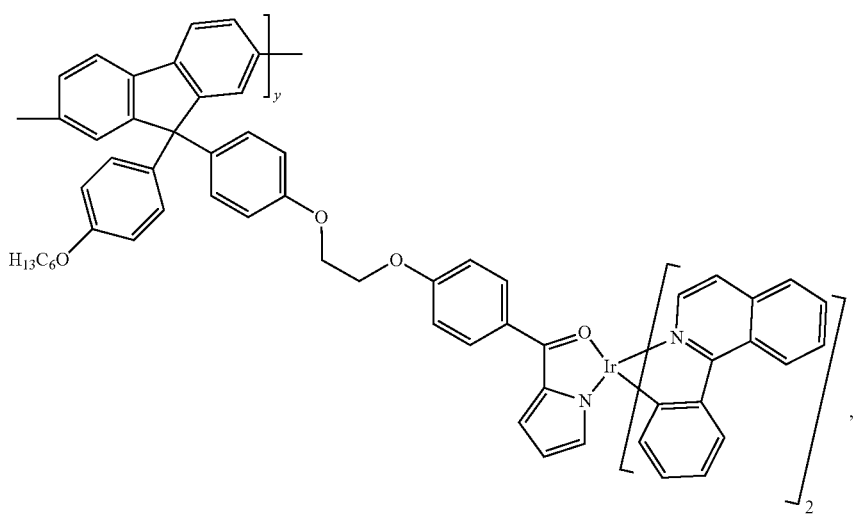
wherein x+y=100.
In some embodiments, the polymer comprises structural units derived from

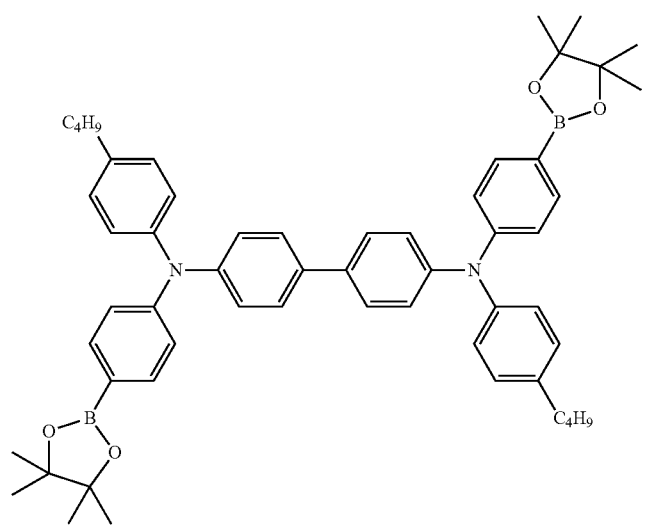
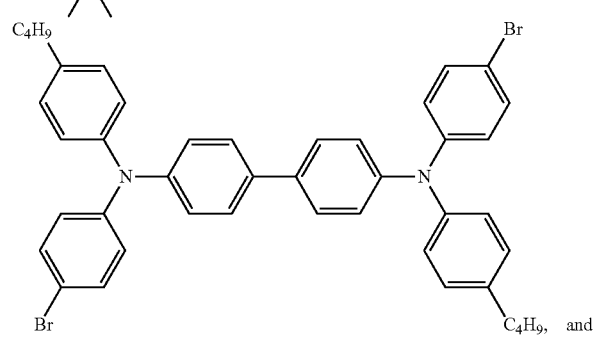
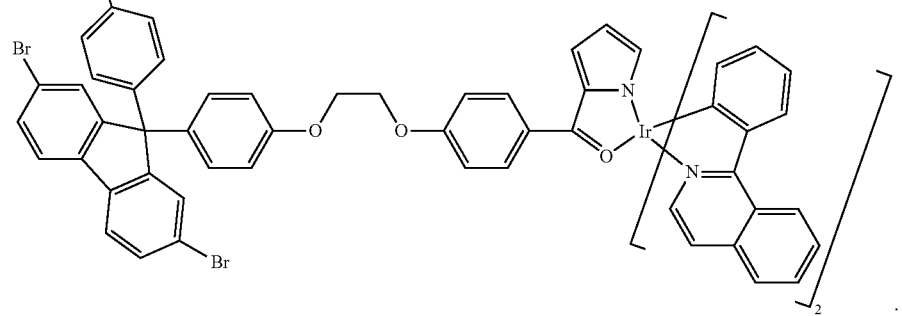
In some embodiments, the polymer comprises structural units derived from
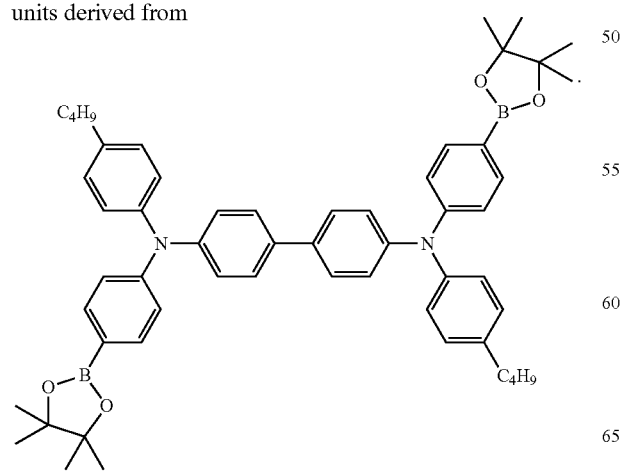
In some embodiments, the polymer comprises structural units derived from
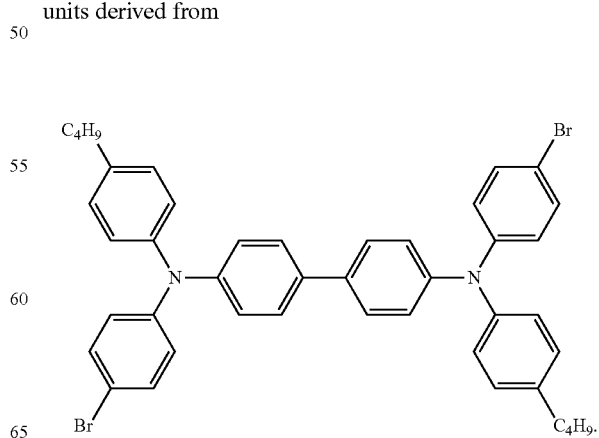

In some embodiments, the polymer comprises structural units derived from

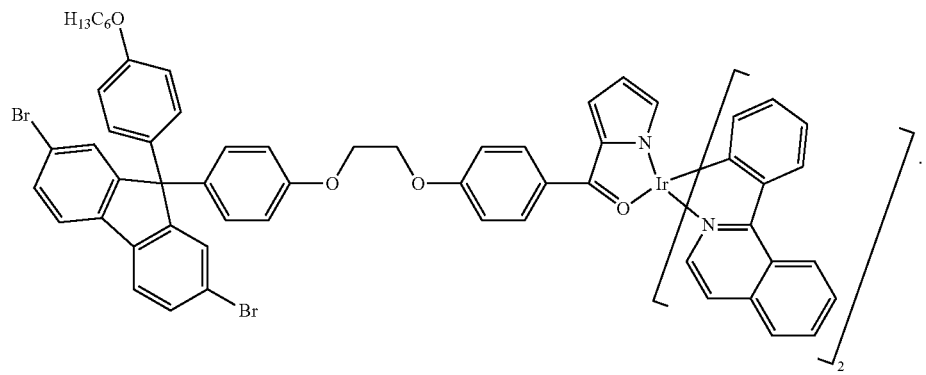

The polymers are made by processes comprising Suzuki cross-coupling reactions in a suitable solvent, in the presence of a base and Pd catalyst. The reaction mixture is heated under an inert atmosphere for a period of time. Suitable solvents include but are not limited to dioxane, THF, EtOH, toluene and mixtures thereof. Exemplary bases include KOAc, $Na_2CO_3$, $K_2CO_3$, $Cs_2CO_3$, potassium phosphate and hydrates thereof. The bases can be added to the reaction as a solid powder or as an aqueous solution. The most commonly used catalysts include $Pd(PPh_3)_4$, $Pd_2(dba)_3$, or $Pd(OAc)_2$, $Pd(dba)_2$ with the addition of a secondary ligand. Exemplary ligands include dialkylphosphinobiphenyl ligands, such as structures V-IX shown below, in which Cy is cyclohexyl.

V

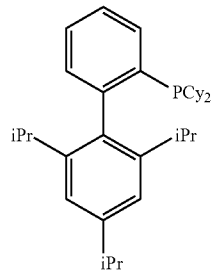

VI

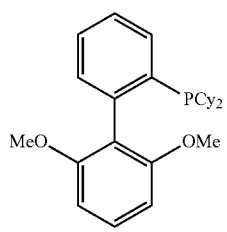

VII

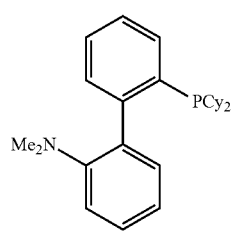

-continued

VIII

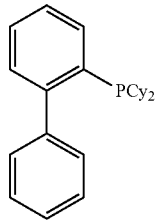

IX

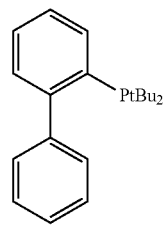

In certain embodiments, the polymerization reaction is conducted for a time period necessary to achieve a polymer of a suitable molecular weight. The molecular weights of a polymer is determined by any of the techniques known to those skilled in the art, and include viscosity measurements, light scattering, and osmometry. The molecular weight of a polymer is typically represented as a number average molecular weight Mn, or weight average molecular weight, Mw. A particularly useful technique to determine molecular weight averages is gel permeation chromatography (GPC), from which both number average and weight average molecular weights are obtained. Molecular weight of the polymers is not critical, and in some embodiments, polymers of Mw greater than 30,000 grams per mole (g/mol) are desirable, in other embodiments, polymers of Mw greater than 50,000 g/mol are desirable, while in yet other embodiments, polymer of Mw greater than 80,000 g/mol are desirable.

Those skilled in the art will understand that the phrase "as determined by gel permeation chromatography relative to polystyrene standards" involves calibration of the GPC-instrument using polystyrene molecular weight standards having a known molecular weight. Such molecular weight standards are commercially available and techniques for molecular weight calibration are routinely used by those skilled in the art. The molecular weight parameters referred to herein contemplate the use of chloroform as the solvent used for the GPC analysis as reflected in the experimental section of this disclosure.

The polymer has a highest occupied molecular orbital (HOMO) of 4.8 eV. The polymer comprises both hole transport moiety and light emissive moiety and is insoluble in solvents subsequently applied in forming multi-layer optoelectronic devices using wet-coating or printing processes. The polymer is usable for example in white OLEDs which are fabricated by wet-coating or printing processes and which have more than one light emissive layers. The polymer is usable in at least one of the more than one light emissive layers of the white OLEDs.

An optoelectronic device, e.g., an OLED, typically includes in the simplest case, an anode layer and a corresponding cathode layer with an organic electroluminescent layer disposed between said anode and said cathode. When a voltage bias is applied across the electrodes, electrons are injected by the cathode into the electroluminescent layer while electrons are removed from (or "holes" are "injected" into) the electroluminescent layer from the anode. Light emission occurs as holes combine with electrons within the electroluminescent layer to form singlet or triplet excitons, light emission occurring as singlet and/or triplet excitons decay to their ground states via radiative decay.

Other components which may be present in an OLED in addition to the anode, cathode and light emitting material include a hole injection layer, an electron injection layer, and an electron transport layer. The electron transport layer need not be in direct contact with the cathode, and frequently the electron transport layer also serves as a hole blocking layer to prevent holes migrating toward the cathode. Additional components which may be present in an organic light-emitting device include hole transporting layers, hole transporting emission (emitting) layers and electron transporting emission (emitting) layers.

In one embodiment, the OLEDs comprising the polymers of the invention may be a fluorescent OLED comprising a singlet emitter. In another embodiment, the OLEDs comprising the polymers of the invention may be a phosphorescent OLED comprising at least one triplet emitter. In another embodiment, the OLEDs comprising the polymers of the invention comprise at least one singlet emitter and at least one triplet emitter. The OLEDs comprising the polymers of the invention may contain one or more, any or a combination of blue, yellow, orange, red phosphorescent dyes, including complexes of transition metals such as Ir, Os and Pt. In particular, electrophosphorescent and electrofluorescent metal complexes, such as those supplied by American Dye Source, Inc., Quebec, Canada may be used. Polymers comprising structural unit of any of formula I to IV may be part of an emissive layer, or hole transporting layer or electron transporting layer, or electron injection layer of an OLED or any combination thereof.

The organic electroluminescent layer, i.e., the emissive layer, is a layer within an organic light emitting device which when in operation contains a significant concentration of both electrons and holes and provides sites for exciton formation and light emission. A hole injection layer is a layer in contact with the anode which promotes the injection of holes from the anode into the interior layers of the OLED; and an electron injection layer is a layer in contact with the cathode that promotes the injection of electrons from the cathode into the OLED; an electron transport layer is a layer which facilitates conduction of electrons from the cathode and/or the electron injection layer to a charge recombination site. During operation of an organic light emitting device comprising an electron transport layer, the majority of charge carriers (i.e. holes and electrons) present in the electron transport layer are electrons and light emission can occur through recombination of holes and electrons present in the emissive layer. A hole transporting layer is a layer which when the OLED is in operation facilitates conduction of holes from the anode and/or the hole injection layer to charge recombination sites and which need not be in direct contact with the anode. A hole transporting emission layer is a layer in which when the OLED is in operation facilitates the conduction of holes to charge recombination sites, and in which the majority of charge carriers are holes, and in which emission occurs not only through recombination with residual electrons, but also through the transfer of energy from a charge recombination zone elsewhere in the device. An electron transporting emission layer is a layer in which when the OLED is in operation facilitates the conduction of electrons to charge recombination sites, and in which the majority of charge carriers are electrons, and in which emission occurs not only through recombination with residual holes, but also through the transfer of energy from a charge recombination zone elsewhere in the device.

Materials suitable for use as the anode includes materials having a bulk resistivity of preferred about 1000 ohms per square, as measured by a four-point probe technique. Indium tin oxide (ITO) is frequently used as the anode because it is substantially transparent to light transmission and thus facilitates the escape of light emitted from electro-active organic layer. Other materials, which may be utilized as the anode layer, include tin oxide, indium oxide, zinc oxide, indium zinc oxide, zinc indium tin oxide, antimony oxide, and mixtures thereof.

Materials suitable for use as the cathode include general electrical conductors including, but not limited to metals and metal oxides such as ITO etc which can inject negative charge carriers (electrons) into the inner layer(s) of the OLED. Various metals suitable for use as the cathode include K, Li, Na, Cs, Mg, Ca, Sr, Ba, Al, Ag, Au, In, Sn, Zn, Zr, Sc, Y, elements of the lanthanide series, alloys thereof, and mixtures thereof. Suitable alloy materials for use as the cathode layer include Ag—Mg, Al—Li, In—Mg, Al—Ca, and Al—Au alloys. Layered non-alloy structures may also be employed in the cathode, such as a thin layer of a metal such as calcium, or a metal fluoride, such as LiF, covered by a thicker layer of a metal, such as aluminum or silver. In particular, the cathode may be composed of a single metal, and especially of aluminum metal.

Materials suitable for use in electron transport layers include poly(9,9-dioctyl fluorene), tris(8-hydroxyquinolato) aluminum ($Alq_3$), 2,9-dimethyl-4,7-diphenyl-1,1-phenanthroline, 4,7-diphenyl-1,10-phenanthroline, 2-(4-biphenylyl)-5-(4-t-butylphenyl)-1,3,4-oxadiazole, 3-(4-biphenylyl)-4-phenyl-5-(4-t-butylphenyl)-1,2,4-triazole, 1,3,4-oxadiazole-containing polymers, 1,3,4-triazole-containing polymers, quinoxaline-containing polymers, and cyano-PPV.

Materials suitable for use in hole transporting layers include such as 1,1-bis((di-4-tolylamino) phenyl)cyclohexane, N,N'-bis(4-methylphenyl)-N,N'-bis(4-ethylphenyl)-(1,1'-(3,3'-dimethyl)biphenyl)-4,4'-diamine, tetrakis-(3-methylphenyl)-N,N,N',N'-2,5-phenylenediamine, phenyl-4-N,N-diphenylaminostyrene, p-(diethylamino) benzaldehyde diphenylhydrazone, triphenylamine, 1-phenyl-3-(p-(diethylamino)styryl)-5-(p-(diethylamino)phenyl)pyrazoline, 1,2-trans-bis(9H-carbazol-9-yl)cyclobutane, N,N,N',N'-tetrakis (4-methylphenyl)-(1,1'-biphenyl)-4,4'-diamine, copper phthalocyanine, polyvinylcarbazole, (phenylmethyl)polysilane; poly(3,4-ethylenedioxythiophene) (PEDOT), polyaniline, polyvinylcarbazole, triaryldiamine, tetraphenyldiamine, aromatic tertiary amines, hydrazone derivatives, carbazole derivatives, triazole derivatives, imidazole derivatives, oxadiazole derivatives having an amino group, and polythiophenes as disclosed in U.S. Pat. No. 6,023,371

Polymers comprising structural units of any of formula I to IV may be used in the light emitting layer in place of, or in addition to traditional electroluminescent polymers such as polyfluorenes, preferably poly(9,9-dioctyl fluorene) and copolymers thereof, such as poly(9,9'-dioctylfluorene-co-bis-N,N'-(4-butylphenyl)diphenylamine) (F8-TFB); poly(vinylcarbazole) and polyphenylenevinylene and their derivatives. In addition, the light emitting layer may include a blue, yellow, orange, green or red phosphorescent dye or metal complex, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorophenyl)pyridinato-N,C2) (blue dye). Commercially available electrofluorescent and electrophosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE.

Polymers comprising structural unit of any of formula I to IV may form part of the hole transport layer or hole injection layer or light emissive layer of optoelectronic devices, e.g., OLEDs. The OLEDs may be phosphorescent containing one or more, any or a combination of, blue, yellow, orange, green, red phosphorescent dyes.

DEFINITIONS

As used herein, the term "aromatic radical" refers to an array of atoms having a valence of at least one comprising at least one aromatic group. The array of atoms having a valence of at least one comprising at least one aromatic group may include heteroatoms such as nitrogen, sulfur, selenium, silicon and oxygen, or may be composed exclusively of carbon and hydrogen. As used herein, the term "aromatic radical" includes but is not limited to phenyl, pyridyl, furanyl, thienyl, naphthyl, phenylene, and biphenyl radicals. As noted, the aromatic radical contains at least one aromatic group. The aromatic group is invariably a cyclic structure having 4n+2 "delocalized" electrons where "n" is an integer equal to 1 or greater, as illustrated by phenyl groups (n=1), thienyl groups (n=1), furanyl groups (n=1), naphthyl groups (n=2), azulenyl groups (n=2), and anthracenyl groups (n=3). The aromatic radical may also include nonaromatic components. For example, a benzyl group is an aromatic radical which comprises a phenyl ring (the aromatic group) and a methylene group (the nonaromatic component). Similarly a tetrahydronaphthyl radical is an aromatic radical comprising an aromatic group ($C_6H_3$) fused to a nonaromatic component —$(CH_2)_4$—. For convenience, the term "aromatic radical" is defined herein to encompass a wide range of functional groups such as alkyl groups, alkenyl groups, alkynyl groups, haloalkyl groups, haloaromatic groups, conjugated dienyl groups, alcohol groups, ether groups, aldehydes groups, ketone groups, carboxylic acid groups, acyl groups (for example carboxylic acid derivatives such as esters and amides), amine groups, nitro groups, and the like. For example, the 4-methylphenyl radical is a $C_7$ aromatic radical comprising a methyl group, the methyl group being a functional group which is an alkyl group. Similarly, the 2-nitrophenyl group is a $C_6$ aromatic radical comprising a nitro group, the nitro group being a functional group. Aromatic radicals include halogenated aromatic radicals such as 4-trifluoromethylphenyl, hexafluoroisopropylidenebis(4-phen-1-yloxy) (i.e., —OPhC$(CF_3)_2$PhO—), 4-chloromethylphen-1-yl, 3-trifluorovinyl-2-thienyl, 3-trichloromethylphen-1-yl (i.e., 3-CCl$_3$Ph-), 4-(3-bromoprop-1-yl)phen-1-yl (i.e., 4-BrCH$_2$CH$_2$CH$_2$Ph-), and the like. Further examples of aromatic radicals include 4-allyloxyphen-1-oxy, aminophen-1-yl (i.e., 4-H$_2$NPh-), 3-aminocarbonylphen-1-yl (i.e., NH$_2$COPh-), 4-benzoylphen-1-yl, dicyanomethylidenebis(4-phen-1-yloxy) (i.e., —OPhC$(CN)_2$PhO—), 3-methylphen-1-yl, methylenebis(4-phen-1-yloxy) (i.e., —OPhCH$_2$PhO—), 2-ethylphen-1-yl, phenylethenyl, 3-formyl-2-thienyl, 2-hexyl-5-furanyl, hexamethylene-1,6-bis(4-phen-1-yloxy) (i.e., —OPh(CH$_2)_6$PhO—), 4-hydroxymethylphen-1-yl (i.e., 4-HOCH$_2$Ph-), 4-mercaptomethylphen-1-yl (i.e., 4-HSCH$_2$Ph-), 4-methylthiophen-1-yl (i.e., 4-CH$_3$SPh-), 3-methoxyphen-1-yl, 2-methoxycarbonylphen-1-yloxy (e.g. methyl salicyl), 2-nitromethylphen-1-yl (i.e., 2-NO$_2$CH$_2$Ph), 3-trimethylsilylphen-1-yl, 4-t-butyldimethylsilylphenl-1-yl, 4-vinylphen-1-yl, vinylidenebis(phenyl), and the like. The term "a $C_3$-$C_{20}$ aromatic radical" includes aromatic radicals containing at least three but no more than 20 carbon atoms. The aromatic radical 1-imidazolyl ($C_3H_2N_2$—) represents a $C_3$ aromatic radical. The benzyl radical ($C_7H_7$—) represents a $C_7$ aromatic radical.

As used herein the term "cycloaliphatic radical" refers to a radical having a valence of at least one, and comprising an array of atoms which is cyclic but which is not aromatic. As defined herein a "cycloaliphatic radical" does not contain an aromatic group. A "cycloaliphatic radical" may comprise one or more noncyclic components. For example, a cyclohexylmethyl group ($C_6H_{11}CH_2$—) is an cycloaliphatic radical which comprises a cyclohexyl ring (the array of atoms which is cyclic but which is not aromatic) and a methylene group (the noncyclic component). The cycloaliphatic radical may include heteroatoms such as nitrogen, sulfur, selenium, silicon and oxygen, or may be composed exclusively of carbon and hydrogen. For convenience, the term "cycloaliphatic radical" is defined herein to encompass a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylcyclopent-1-yl radical is a $C_6$ cycloaliphatic radical comprising a methyl group, the methyl group being a functional group which is an alkyl group. Similarly, the 2-nitrocyclobut-1-yl radical is a $C_4$ cycloaliphatic radical comprising a nitro group, the nitro group being a functional group. A cycloaliphatic radical may comprise one or more halogen atoms which may be the same or different. Halogen atoms include, for example; fluorine, chlorine, bromine, and iodine. Cycloaliphatic radicals comprising one or more halogen atoms include 2-trifluoromethylcyclohex-1-yl, 4-bromodifluoromethylclooct-1-yl, 2-chlorodifluoromethylcyclohex-1-yl, hexafluoroisopropylidene-2,2-bis (cyclohex-4-yl) (i.e., —$C_6H_{10}$C$(CF_3)_2$ $C_6H_{10}$—), 2-chloromethylcyclohex-1-yl, 3-difluoromethylenecyclohex-1-yl, 4-trichloromethylcyclohex-1-yloxy, 4-bromodichloromethylcyclohex-1-ylthio, 2-bromoethylcyclopent-1-yl, 2-bromopropylcyclohex-1-yloxy (e.g. CH$_3$CHBrCH$_2$C$_6$H$_{10}$O—), and the like. Further examples of cycloaliphatic radicals include 4-allyloxycyclohex-1-yl, 4-aminocyclohex-1-yl (i.e., H$_2$C$_6$H$_{10}$—), 4-aminocarbonylcyclopent-1-yl (i.e., NH$_2$COC$_5$H$_8$—), 4-acetyloxycyclohex-1-yl, 2,2-dicyanoisopropylidenebis(cyclohex-4-yloxy) (i.e., —OC$_6$H$_{10}$C(CN)$_2$C$_6$H$_{10}$O—), 3-methylcyclohex-1-yl, methylenebis(cyclohex-4-yloxy) (i.e., —OC$_6$H$_{10}$CH$_2$C$_6$H$_{10}$O—), 1-ethylcyclobut-1-yl, cyclopropylethenyl, 3-formyl-2-tetrahydrofuranyl, 2-hexyl-5-tetrahydrofuranyl, hexamethylene-1,6-bis(cyclohex-4-yloxy) (i.e., —OC$_6$H$_{10}$(CH$_2$)$_6$C$_6$H$_{10}$O—), 4-hydroxymethylcyclohex-1-yl (i.e., 4-HOCH$_2$C$_6$H$_{10}$—), 4-mercaptomethylcyclohex-1-yl (i.e., 4-HSCH$_2$C$_6$H$_{10}$—), 4-methylthiocyclohex-1-yl (i.e., 4-CH$_3$SC$_6$H$_{10}$—), 4-methoxycyclohex-1-yl, 2-methoxycarbonylcyclohex-1-yloxy (2-CH$_3$OCOC$_6$H$_{10}$O—), 4-nitromethylcyclohex-1-yl (i.e., NO$_2$CH$_2$C$_6$H$_{10}$—), 3-trimethylsilylcyclohex-1-yl, 2-t-butyldimethylsilylcyclopent-1-yl, 4-trimethoxysilylethylcyclohex-1-yl (e.g. (CH$_3$O)$_3$SiCH$_2$CH$_2$C$_6$H$_{10}$—), 4-vinylcyclohexen-1-yl, vinylidenebis(cyclohexyl), and the like. The term "a C$_3$-C$_{10}$ cycloaliphatic radical" includes cycloaliphatic radicals containing at least three but no more than 10 carbon atoms. The cycloaliphatic radical 2-tetrahydrofuranyl (C$_4$H$_7$O—) represents a C$_4$ cycloaliphatic radical. The cyclohexylmethyl radical (C$_6$H$_{11}$CH$_2$—) represents a C$_7$ cycloaliphatic radical.

As used herein the term "aliphatic radical" refers to an organic radical having a valence of at least one consisting of a linear or branched array of atoms which is not cyclic. Aliphatic radicals are defined to comprise at least one carbon atom. The array of atoms comprising the aliphatic radical may include heteroatoms such as nitrogen, sulfur, silicon, selenium and oxygen or may be composed exclusively of carbon and hydrogen. For convenience, the term "aliphatic radical" is defined herein to encompass, as part of the "linear or branched array of atoms which is not cyclic" organic radicals substituted with a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylpent-1-yl radical is a C$_6$ aliphatic radical comprising a methyl group, the methyl group being a functional group which is an alkyl group. Similarly, the 4-nitrobut-1-yl group is a C$_4$ aliphatic radical comprising a nitro group, the nitro group being a functional group. An aliphatic radical may be a haloalkyl group which comprises one or more halogen atoms which may be the same or different. Halogen atoms include, for example; fluorine, chlorine, bromine, and iodine. Aliphatic radicals comprising one or more halogen atoms include the alkyl halides trifluoromethyl, bromodifluoromethyl, chlorodifluoromethyl, hexafluoroisopropylidene, chloromethyl, difluorovinylidene, trichloromethyl, bromodichloromethyl, bromoethyl, 2-bromotrimethylene (e.g. —CH$_2$CHBrCH$_2$—), and the like. Further examples of aliphatic radicals include allyl, aminocarbonyl (i.e., —CONH$_2$), carbonyl, 2,2-dicyanoisopropylidene (i.e., —CH$_2$C(CN)$_2$CH$_2$—), methyl (i.e., —CH$_3$), methylene (i.e., —CH$_2$—), ethyl, ethylene, formyl (i.e. —CHO), hexyl, hexamethylene, hydroxymethyl (i.e. —CH$_2$OH), mercaptomethyl (i.e., —CH$_2$SH), methylthio (i.e., —SCH$_3$), methylthiomethyl (i.e., —CH$_2$SCH$_3$), methoxy, methoxycarbonyl (i.e., CH$_3$OCO—), nitromethyl (i.e., —CH$_2$NO$_2$), thiocarbonyl, trimethylsilyl (i.e., (CH$_3$)$_3$Si—), t-butyldimethylsilyl, 3-trimethyoxysilylpropyl (i.e., (CH$_3$O)$_3$SiCH$_2$CH$_2$CH$_2$—), vinyl, vinylidene, and the like. By way of further example, a C$_1$-C$_{20}$ aliphatic radical contains at least one but no more than 20 carbon atoms. A methyl group (i.e., CH$_3$—) is an example of a C$_1$ aliphatic radical. A decyl group (i.e., CH$_3$(CH$_2$)$_9$—) is an example of a C$_{10}$ aliphatic radical.

The term "heteroaryl" as used herein refers to aromatic or unsaturated rings in which one or more carbon atoms of the aromatic ring(s) are replaced by a heteroatom(s) such as nitrogen, oxygen, boron, selenium, phosphorus, silicon or sulfur. Heteroaryl refers to structures that may be a single aromatic ring, multiple aromatic ring(s), or one or more aromatic rings coupled to one or more non-aromatic ring(s). In structures having multiple rings, the rings can be fused together, linked covalently, or linked to a common group such as an ether, methylene or ethylene moiety. The common linking group may also be a carbonyl as in phenyl pyridyl ketone. Examples of heteroaryl rings include thiophene, pyridine, isoxazole, pyrazole, pyrrole, furan, imidazole, indole, thiazole, benzimidazole, quinoline, isoquinoline, quinoxaline, pyrimidine, pyrazine, tetrazole, triazole, benzo-fused analogues of these groups, benzopyranone, phenylpyridine, tolylpyridine, benzothienylpyridine, phenylisoquinoline, dibenzoquinozaline, fluorenylpyridine, ketopyrrole, 2-phenylbenzoxazole, 2 phenylbenzothiazole, thienylpyridine, benzothienylpyridine, 3 methoxy-2-phenylpyridine, phenylimine, pyridylnaphthalene, pyridylpyrrole, pyridylimidazole, and phenylindole.

The term "aryl" is used herein to refer to an aromatic substituent which may be a single aromatic ring or multiple aromatic rings which are fused together, linked covalently, or linked to a common group such as an ether, methylene or ethylene moiety. The aromatic ring(s) may include phenyl, naphthyl, anthracenyl, and biphenyl, among others. In particular embodiments, aryls have between 1 and 200 carbon atoms, between 1 and 50 carbon atoms or between 1 and 20 carbon atoms.

The term "alkyl" is used herein to refer to a branched or unbranched, saturated or unsaturated acyclic hydrocarbon radical. Suitable alkyl radicals include, for example, methyl, ethyl, n-propyl, propyl, 2-propenyl (or allyl), vinyl, n-butyl, t-butyl, i-butyl (or 2-methylpropyl), etc. In particular embodiments, alkyls have between 1 and 200 carbon atoms, between 1 and 50 carbon atoms or between 1 and 20 carbon atoms.

The term "cycloalkyl" is used herein to refer to a saturated or unsaturated cyclic non-aromatic hydrocarbon radical having a single ring or multiple condensed rings. Suitable cycloalkyl radicals include, for example, cyclopentyl, cyclohexyl, cyclooctenyl, bicyclooctyl, etc. In particular embodiments, cycloalkyls have between 3 and 200 carbon atoms, between 3 and 50 carbon atoms or between 3 and 20 carbon atoms.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

EXAMPLES

Example 1

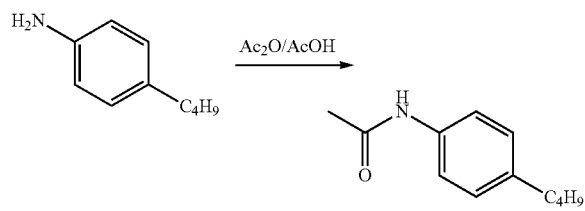

N-Butyl aniline (50 g, 0.34 mol) was dissolved in 90 mL of AcOH under ice cooling. Ac$_2$O (40 mL) was added drop wise to ensure that the temperature did not exceed 30° C. After that, the reaction mixture was then heated at 40° C. for 1.5 hours. The mixture was cooled to room temperature and poured into H$_2$O (500 mL) to precipitate. The precipitated solid was collected by filtration and dried in a vacuum oven. The solid was crystallized from toluene (60 mL)/hexane (500 mL) to give colorless plates (60.1 g). $^1$H NMR (400 MHz, CD$_2$Cl$_2$, 25° C.) δ 0.92 (t, 3H), 1.35 (m, 2H), 1.56 (m, 2H), 2.10 (s, 3H), 2.57 (t, 2H), 7.12 (d, 2H), 7.32 (bs, 1H), 7.38 (d, 2H).

Example 2

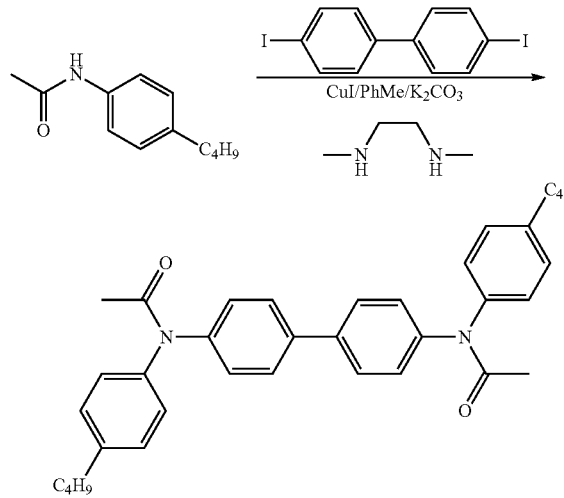

To a nitrogen purged toluene solution (150 mL) were added 4,4'-diiodobiphenyl (26.0 g, 64.1 mmol), n-butyl acetanilide (36.8 g, 192 mmol), K$_2$CO$_3$ (35.4 g, 256 mmol), and the diamine ligand (1.38 mL, 12.8 mmol). After purging this solution for 10 minutes, copper iodide (1.22 g, 6.41 mmol) was added and the mixture was heated at reflux under an atmosphere of nitrogen. The reaction was 50% complete after 12 hours as indicated by thin-layer chromatography (TLC) (CH$_2$Cl$_2$) and heating was continued for another 15 hours. The reaction mixture was cooled and diluted with CH$_2$Cl$_2$ and filtered. The filter cake was washed with CH$_2$Cl$_2$ and the filtrate was concentrated to dryness to give a green oil. The crude solid was dissolved in EtOAc/CH$_2$Cl$_2$ and passed through a 30 cm×10 cm column of SiO$_2$. The combined fractions were concentrated to dryness and the solid was crystallized twice from EtOAc and carried on to the next step without further purification (29.6 g). $^1$H NMR (400 MHz, CD$_2$Cl$_2$, 25° C.) δ 0.93 (t, 6H), 1.35 (m, 4H), 1.60 (m, 4H), 2.04 (s, 6H), 2.62 (t, 4H), 7.21 (bs, 8H), 7.31 (d, 4H), 7.55 (bs, 4H).

Example 3

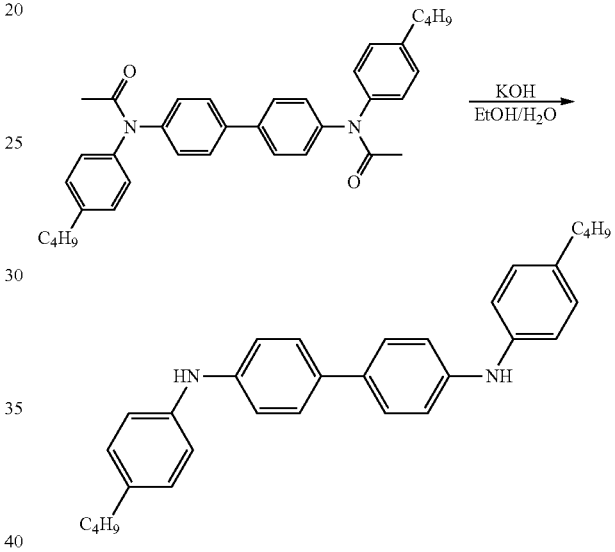

The biphenyl amide (29.6 g) was suspended in 95% EtOH (300 mL) and 40% KOH (50 mL) and heated at reflux for 5 hours. Cooled to 15° C. and solids were collected by filtration and washed with 95% EtOH and dried in a vacuum oven to give 24.4 g of the diamino biphenyl as a white crystalline solid. $^1$H NMR (400 MHz, CD$_2$Cl$_2$, 25° C.) δ 0.94 (t, 6H), 1.38 (m, 4H), 1.58 (m, 4H), 2.57 (t, 4H), 5.78 (s, 2H), 7.07 (m, 12H), 7.46 (d, 4H).

Example 4

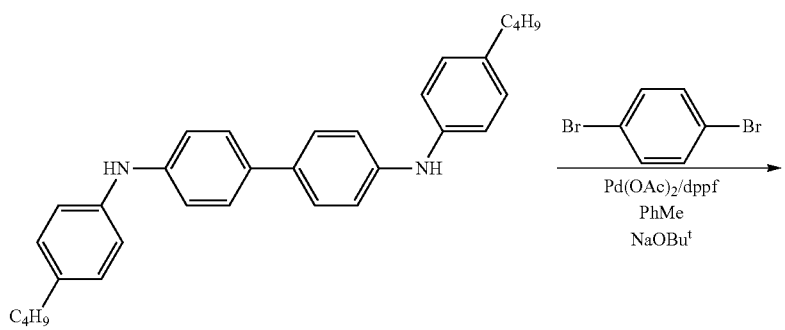

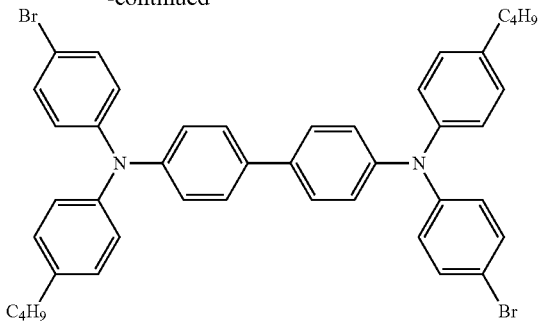

An anhydrous toluene (PhMe) solution (150 mL) containing diphenylphosphinoferrocene (dppf) (1.15 g, 2.08 mmol) and Pd(OAc)$_2$ (233 mg, 1.04 mmol) was purged with nitrogen while the diamino biphenyl (10 g, 22.3 mmol) and 1,4-dibromobenzene (52.6 g, 223 mmol) were added. After purging for 10 minutes, NaOBu$^t$ (6.4 g, 66.9 mmol) was added which caused the reaction mixture to turn green in color. Upon heating to reflux the reaction mixture changed in color to blood red. The progress of the reaction was monitored by TLC (10% CH$_2$Cl$_2$/hexane) and after 4 hours TLC indicated that the reaction was complete. The reaction mixture was then cooled to room temperature and diluted with EtOAc and treated with mercapto-functionalized SiO$_2$ (4.0 g) and stirred for 45 minutes. The mixture was then filtered through a bed of celite and washed with EtOAc. The filtrate was adsorbed onto SiO$_2$ and chromatographed through SiO$_2$ (10% CH$_2$Cl$_2$/Hexanes) to give a white foam (dimer-bromide monomer, 12.6 g). $^1$H NMR (400 MHz, CD$_2$Cl$_2$, 25° C.) δ 0.94 (t, 6H), 1.37 (m, 4H), 1.59 (m, 4H), 2.58 (s, 4H), 6.95 (d, 4H), 7.02 (d, 4H), 7.08 (d, 4H), 7.12 (d, 4H), 7.33 (d, 4H), 7.46 (d, 4H).

Example 5

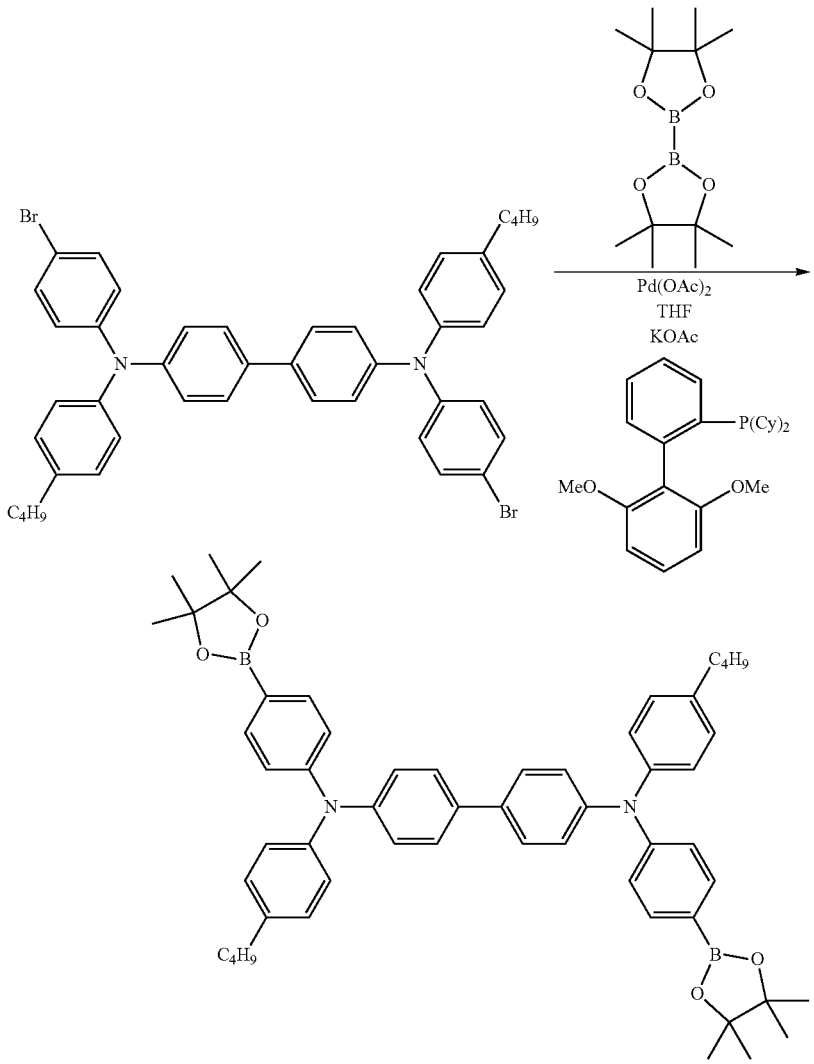

A flame dried flask was placed under an atmosphere of nitrogen and was charged with the dimer-bromide monomer (10.0 g, 13.2 mmol), bis-pinacolatodiborane (10.0 g, 39.5 mmol), anhydrous KOAc (4.0 g, 39.5 mmol), Pd(OAc)$_2$ (65.8 mg, 0.29 mmol), and the cyclohexylphosphine ligand (263 mg, 0.64 mmol). To this flask was added anhydrous THF (75 mL) and the stirred solution was purged with nitrogen for 10 minutes and then heated at reflux until TLC (CH$_2$Cl$_2$/hexane) indicated that the starting dimer-bromide monomer no longer remained. At this point the reaction mixture was cooled to room temperature and diluted with an equal volume of CH$_2$Cl$_2$/hexane (1:1), filtered through a bed of celite, washed with CH$_2$Cl$_2$/hexane, and the filtrate was concentrated to dryness. The residue was chromatographed through SiO$_2$ eluting with CH$_2$Cl$_2$/hexane (1:1) to give 4.8 g of an off-white foam (dimer-bis borate monomer). $^1$H NMR (400 MHz, CD$_2$Cl$_2$, 25° C.) δ 0.95 (t, 6H), 1.31 (s, 24H), 1.38 (m, 4H), 1.61 (m, 4H), 2.59 (s, 4H), 7.03 (m, 8H), 7.11 (m, 8H), 7.48 (d, 4H), 7.60 (d, 4H).

Example 6

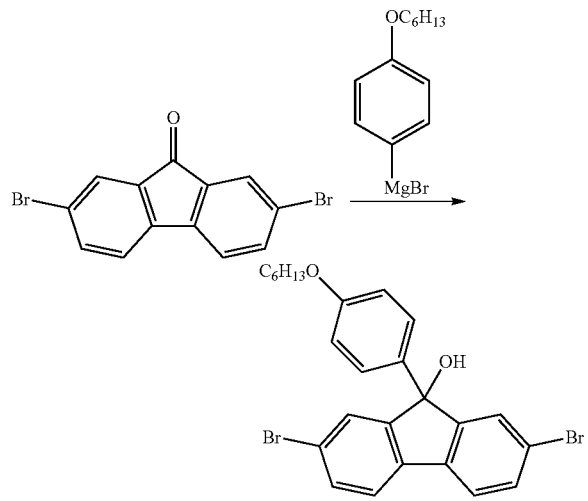

Bromo-(4-hexyloxy)-benzene was prepared by alkylation of 4-bromophenol (91.2 g, 527 mmol) with bromohexane (86.0 g, 520 mmol), K$_2$CO$_3$ (80.0 g, 580 mmol) in acetone (200 mL) at reflux for 12 hours. After removal of the salts by filtration, the reaction mixture was concentrated to dryness to give an oil. The oil was dissolved in EtOAc (100 mL) and transferred to a separatory funnel and washed with 5% NaOH (4×200 mL). An additional 200 mL volume of EtOAc was added to the separatory funnel and the contents were washed with NaHCO$_3$ (1×200 mL) and finally dried over MgSO$_4$. Removal of the EtOAc solvents afforded a light yellow oil and was used without further purification. Yield: 119 g, 89%. $^1$H NMR (500 MHz, CD$_2$Cl$_2$, 25° C.) δ 0.91 (t, 3H), 1.34 (m, 4H), 1.45 (m, 2H), 1.76 (m, 2H), 3.92 (t, 2H), 6.79 (d, 2H), 7.36 (d, 2H).

A dry 250 mL three-neck flask was charged with small Mg turnings (2.80 g, 118 mmol) followed by anhydrous THF (100 mL). A few iodine crystals were added and the heterogeneous mixture was heated at reflux for 15 minutes and then cooled to room temperature. Stirring was stopped and 1,2-dibromoethane (0.25 mL) was added to the reaction vessel. After 5 minutes an exothermic reaction ensued and stirring was resumed for 20 minutes. The reaction was then cooled to 20° C. and bromo-(4-hexyloxy)-benzene (27.8 g, 108 mmol) was added over a period of an hour while keeping the temperature between 14-18° C. The cooling bath was removed and the reaction was stirred for an additional 10 minutes as the temperature of the reaction rose to 28° C. The reaction was cooled to room temperature and the contents were transferred by pipette to a stirred toluene (250 mL) suspension of 2,7,-dibromofluorenone (30.0 g, 90.4 mmol) that was maintained at −10° C. with a cooling bath. The cooling bath was removed and the reaction mixture was stirred at room temperature for 20 minutes and subsequently treated with 20 mL of EtOH and a saturated solution of NH$_4$Cl (5 mL). The reaction mixture was filtered to remove insoluble materials and transferred to a separatory funnel containing EtOAc (100 mL) and H$_2$O (100 mL). The layers were separated and the organic layer was washed with H$_2$O (2×100 mL), brine (1×100 mL), and dried over MgSO$_4$. The solvents were removed to dryness to give a crude yellow solid (50.8 g). The crude material was recrystallized from hexane/CH$_2$Cl$_2$ to afford the product (9-(4-Hexyloxyphenyl)-9H-fluoren-9-ol) as an off-white microcrystalline material. Yield: 38.6 g, 79%. $^1$H NMR (500 MHz, CD$_2$Cl$_2$, 25° C.) δ 0.91 (t, 3H), 1.32 (m, 4H), 1.41 (m, 2H), 1.74 (m, 2H), 2.66 (s, 1H), 3.92 (t, 2H), 6.79 (d, 2H), 7.23 (d, 2H), 7.43 (d, 2H), 7.52 (m, 4H).

Example 7

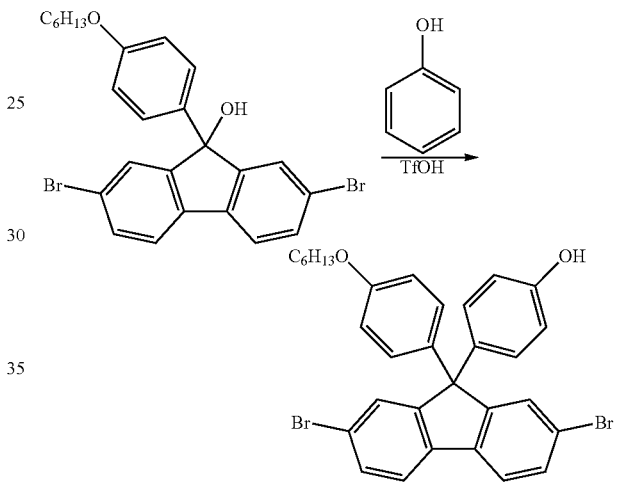

A CH$_2$Cl$_2$ solution (75 mL) of phenol (24 g, 256 mmol) and 9-(4-hexyloxyphenyl)-9H-Fluoren-9-ol (30.0 g, 55.7 mmol) was treated with 20 drops of methanesulfonic acid which caused the solution to change to purple in color. The reaction was stirred at room temperature until TLC analysis indicated that the starting fluorenol was consumed. The reaction mixture was transferred to a separatory funnel and washed with a saturated solution of NaHCO$_3$ (1×200 mL), H$_2$O (3×150 mL), and then the organic layer was dried over MgSO$_4$. The solvents were removed to dryness to give an oil. The oil was adsorbed onto silica gel from a CH$_2$Cl$_2$ solution and the solvents were removed to dryness. The dried silica gel was transferred to the top of a glass fritted funnel (500 mL) containing a packed H$_2$O slurry of silica gel (200 mL) fitted on top of a vacuum flask. The contents of the funnel were flushed with H$_2$O by applying vacuum to the flask which eluted phenol from the silica gel. After excess phenol was removed, the product was eluted from the silica gel with CH$_3$CN. The solvents were removed using a rotary evaporator with a bath at 45° C. which resulted in the formation of a milky solution from which a white solid formed. The product (9-(4-Hexyloxyphenyl)-9'-(4-hydroxyphenyl)-fluorene) was collected by filtration, washed with water and dried. Isolated as a mixture (96:10) of para- and ortho-isomers of the hydroxyphenol adduct. Yield: 34.0 g, 98%. $^1$H NMR (500 MHz, CD$_2$Cl$_2$, 25° C.) δ 0.89 (t, 3H), 1.32 (m, 4H), 1.43 (m, 2H), 1.74 (m, 2H), 3.91 (t, 2H), 4.90 (s, 1H), 6.72 (d, 2H), 6.77 (d, 2H), 7.01 (d, 2H), 7.04 (d, 2H), 7.47 (d, 2H), 7.50 (d, 2H), 7.63 (d, 2H).

Example 8

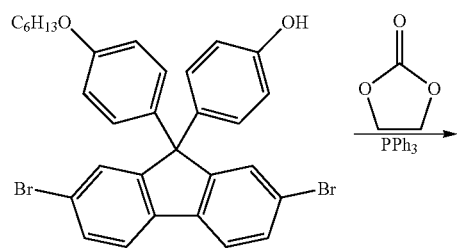

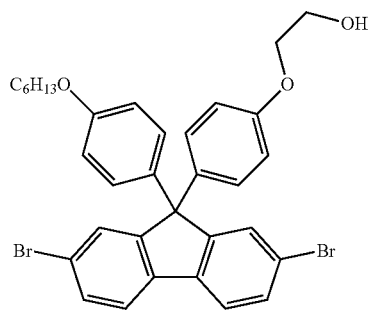

The 9-(4-Hexyloxyphenyl)-9'-(4-hydroxyphenyl)-fluorene (33.0 g, 53.7 mmol) was dissolved in xylene (30 mL), dried over MgSO$_4$, and filtered. The solution was concentrated on a rotary evaporator until the contents of the flask weighed 70 g. The xylene solution of 9-(4-Hexyloxyphenyl)-9'-(4-hydroxyphenyl)-fluorene was then placed under an inert atmosphere of nitrogen and treated with ethylene carbonate (3.9 mL, 59.0 mmol) which was then heated at reflux for 15 hours. After this, the reaction was cooled to room temperature and the solvents were removed to give a yellow oil. The oil was chromatographed through 2 L of SiO$_2$ and eluted with CH$_2$Cl$_2$. The product (9-(4-Hexyloxyphenyl)-9'-(4-(2-hydroxyethoxy)phenyl)-fluorene) was isolated as a colorless oil after removal of the solvents. Yield 29.1 g, 82%. $^1$H NMR (500 MHz, CD$_2$Cl$_2$, 25° C.) δ 0.94 (t, 3H), 1.36 (m, 4H), 1.47 (m, 2H), 1.78 (m, 2H), 2.03 (t, 1H), 3.94 (m, 4H), 4.07 (t, 2H), 6.81 (d, 2H), 6.85 (d, 2H), 7.08 (d, 2H), 7.11 (d, 2H), 7.52 (d, 2H), 7.54 (d, 2H), 7.67 (d, 2H).

Example 9

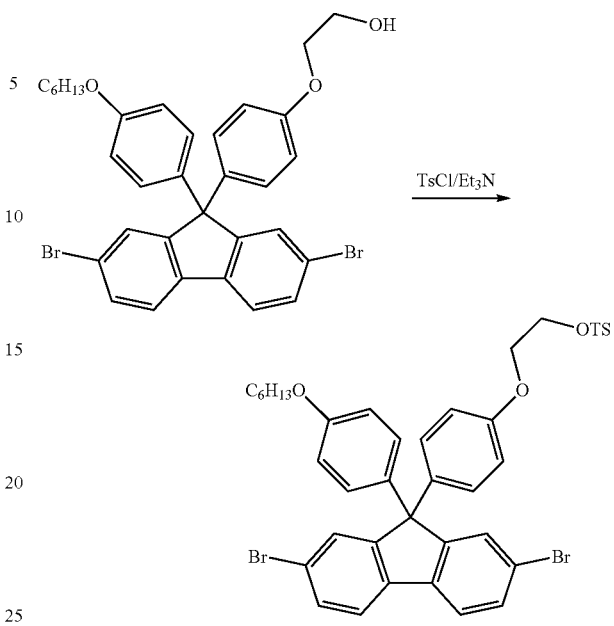

A toluene solution (200 mL) of the ethylene glycol (9-(4-Hexyloxyphenyl)-9'-(4-(2-hydroxyethoxy)phenyl)-fluorene) (29.1 g, 44.2 mmol) was treated with p-toluenesulfonyl chloride (13.3 g, 69.8 mmol) and triethylamine (19.4 mL, 140 mmol) and stirred at room temperature for 60 hours under an inert atmosphere of nitrogen. The reaction mixture was then filtered to remove triethylamine hydrochloride and concentrated to dryness. The residue was dissolved in EtOAc and washed with 5% HCl (1×100 mL), saturated NaHCO$_3$ (2×200 mL), dried over MgSO$_4$, and the solvents were removed to dryness. The crude oil was chromatographed through 1.4 L of SiO$_2$ (CH$_2$Cl$_2$:hexane, 1:1). The product (9-(4-Hexyloxyphenyl)-9'-(4-(2-p-toluenesulfonylethoxy)phenyl)-fluorene) was isolated as a white amorphous solid after removal of the solvents. Yield 33.0 g, 92%. $^1$H NMR (500 MHz, CD$_2$Cl$_2$, 25° C.) δ 0.88 (t, 3H), 1.33 (m, 4H), 1.43 (m, 2H), 1.74 (m, 2H), 2.41 (s, 3H), 3.91 (t, 2H), 4.09 (t, 2H), 4.31 (t, 2H), 6.68 (d, 2H), 6.77 (d, 2H), 7.03 (m, 4H), 7.34 (d, 2H), 7.46 (d, 2H), 7.50 (d, 2H), 7.63 (d, 2H), 7.78 (d, 2H).

Example 10

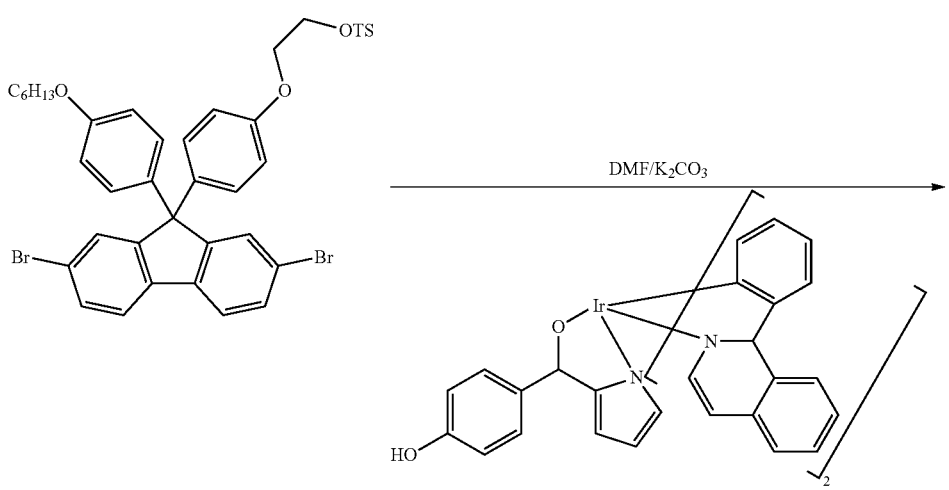

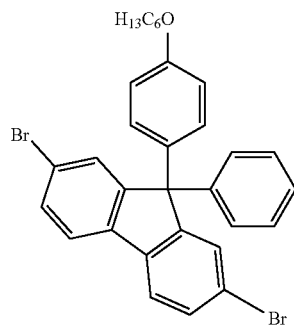
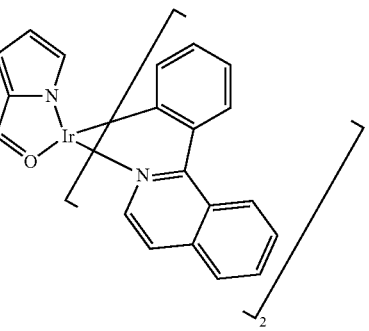

To a stirred DMF solution (25 mL) containing the tosylated fluorene (9-(4-Hexyloxyphenyl)-9'-(4-(2-p-toluenesulfonylethoxy)phenyl)-fluorene) (3.00 g, 4.00 mmol) and the benzoylpyrrole iridium complex ([piq]$_2$Ir(7)], 3.00 g, 3.8 mmol) was added solid K$_2$CO$_3$ (1.00 g, 7.24 mmol). After stirring this solution at 80° C. for 1.5 hours, the reaction was cooled and H$_2$O (75 mL) was added and the red precipitate that formed was sonicated and collected by filtration, washed with water, MeOH, and then dried in air. The product ([(piq)$_2$Ir(7)]-fluorene monomer, or fluorene dye monomer) was chromatographed through SiO$_2$:Toluene and isolated as a red solid after removal of the solvents. Yield 5.00 g, 92%. $^1$H NMR (500 MHz, CD$_2$Cl$_2$, 25° C.) δ 0.89 (t, 3H), 1.33 (m, 4H), 1.42 (m, 2H), 1.73 (m, 2H), 3.90 (t, 2H), 4.27 (m, 2H), 4.34 (m, 2H), 6.30 (dd, 1H), 6.41 (dd, 1H), 6.45 (dd, 1H), 6.51 (t, 1H), 6.77 (m, 6H), 7.00 (m, 8H), 7.19 (dd, 1H), 7.32 (d, 1H), 7.43 (d, 1H), 7.47 (d, 2H), 7.50 (dd, 2H), 7.53 (d, 1H), 7.62 (d, 2H), 7.73 (m, 4H), 7.87 (m, 1H), 7.92 (m, 1H), 7.96 (d, 2H), 8.27 (d, 2H), 8.34 (d, 1H), 8.99 (m, 2H).

Example 11

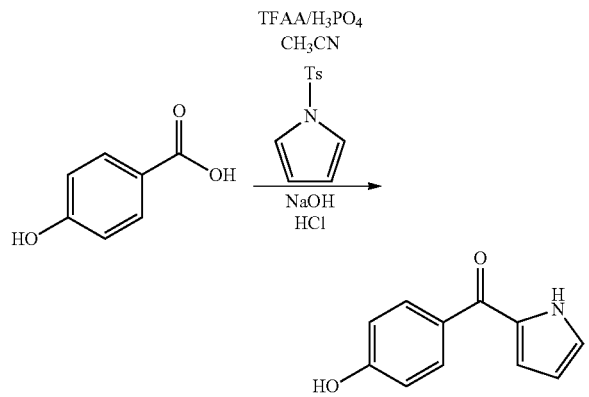

To a stirred suspension of 4-hydroxybenzoic acid (5.50 g, 40.0 mmol) in CH$_3$CN cooled to 0° C. was added trifluoroacetic anhydride (TFAA, 10 mL, 72.0 mmol). After 15 minutes the benzoic acid dissolved. To this cooled solution at 0° C. was added 1-(p-tolylsulfonyl)pyrrole (8.85 g, 40.0 mmol) followed by enough CH$_2$Cl$_2$ to dissolve the pyrrole at this temperature. An additional volume of trifluoroacetic anhydride (10 mL, 72.0 mmol) was added to the reaction mixture followed by H$_3$PO$_4$ (2 mL, 37.0 mmol) with rapid stirring. After the reaction mixture was stirred at room temperature for 12 hours, additional trifluoroacetic anhydride (6 mL, 43.2 mmol) and 4-hydroxybenzoic acid (4.00 g, 29.0 mmol) were added and stirring was continued for 12 hours. After this, the solvents were removed to dryness and the residue was suspended in 5% NaOH (250 mL) and stirred overnight. The suspension was removed by filtration and the filter cake was washed with 5% NaOH (250 mL). To the filtrate was added a saturated solution of NaHCO$_3$ (200 mL) and the pH of the solution was rendered neutral by adding concentrated HCl. A pink microcrystalline material formed and was collected by filtration, washed with water and dried. Yield (2-(4-Hydroxybenzoyl)-pyrrole) 3.30 g, 44%. $^1$H NMR (500 MHz, CD$_2$Cl$_2$, 25° C.) δ 6.35 (m, 1H), 6.90 (m, 1H), 6.94 (d, 2H), 7.14 (m, 1H), 7.87 (d, 2H), 9.70 (bs, 1H).

Example 12

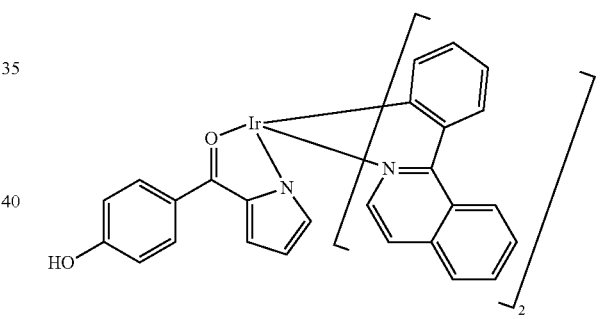

To a stirred and chilled (−10° C.). EtOH solution (100 mL) containing the ketopyrrole (2-(4-Hydroxybenzoyl)-pyrrole) (1.20 g, 6.40 mmol) was added solid sodium hydride (288 mg, 12.0 mmol) which caused the solution to turn from yellow to orange in color. After letting this solution stir for 5 minutes, [(piq)$_2$Ir(μ-Cl)]$_2$ (3.33 g, 2.56 mmol) was added and the mixture was then heated at reflux for 10 hours. The reaction mixture was cooled to room temperature and the red precipitate was collected by filtration. The product ([(piq)$_2$Ir(7)]) was washed with EtOH and dried in air. Yield (3.85 mg, 96%). $^1$H NMR (500 MHz, CD$_2$Cl$_2$, 25° C.) δ6.32 (dd, 1H), 6.42 (dd, 2H), 6.45 (dd, 1H), 6.51 (t, 1H), 6.73 (m, 1H), 6.78 (m, 1H), 6.83 (d, 2H), 7.00 (m, 2H), 7.18 (dd, 1H), 7.31 (d, 1H), 7.43 (d, 1H), 7.53 (d, 1H), 7.73 (m, 4H), 7.89 (m, 4H), 8.27 (m, 2H), 8.34 (d, 1H), 8.99 (m, 2H).

Example 13

Polymer Synthesis

The polymer was prepared according to scheme 1 and materials used are shown in table 1.

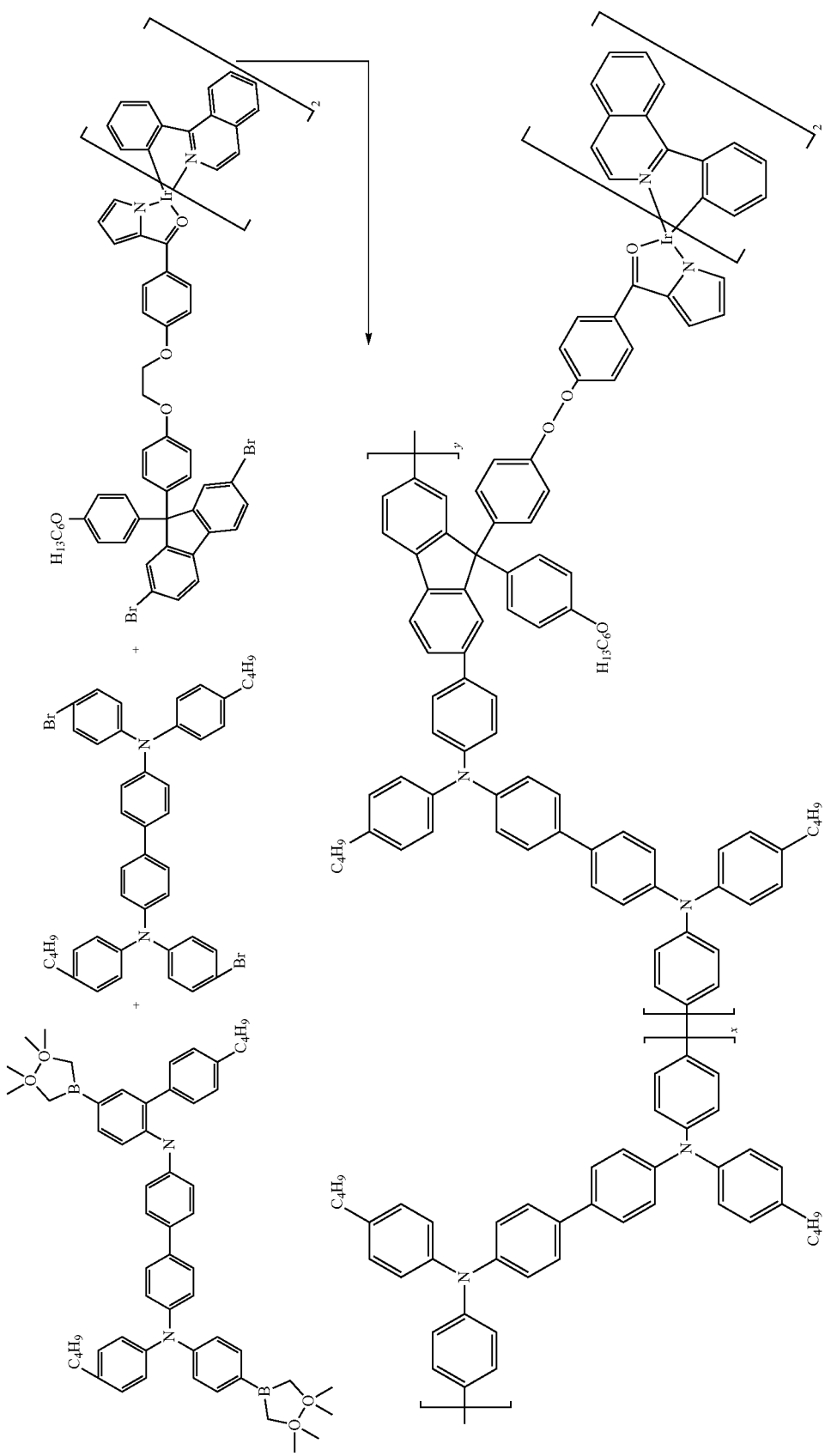
Scheme 1

TABLE 1

| Compound | Mw | mmol | g |
| --- | --- | --- | --- |
| dimer-bis borate monomer | 852.76 | 1.0 | 0.8528 |
| dimer-bromide monomer | 758.63 | 0.850 | 0.6449 |
| fluorene dye monomer | 1406.41 | 0.150 | 0.0211 |
| Pd(OAc)$_2$ | 224 | 0.015 | 0.0034 |
| Ligand 1 | 410 | 0.053 | 0.0216 |
| Et$_4$NOH | 147 | 5.0 | 3.6 |

Ligand 1 was recrystallized from acetone before use. All monomers were dried at 50° C. in a vacuum oven for at least 2 hours prior to weighing. The ligand 1 is 2-dicyclohexylphosphino-2',6'-dimethoxy-biphenyl, Aldrich No. 638072, with structure below.

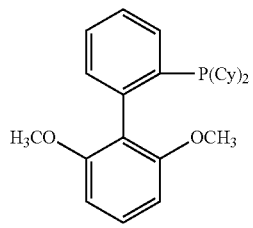

In a three neck round bottom flask (25 or 50 mL), Pd(OAc)$_2$ and ligand 1 were weighed out. To this flask were added three monomers together with 10 mL toluene. Under a gentle stir, after all monomers were dissolved, this solution was degassed with a stream of argon for 15 minutes. Simultaneously in a separate vial, the aqueous solution of Et$_4$NOH (20%) was weighed and transferred into an addition funnel and degassed with argon separately. After at least 15 minutes of degassing, the aqueous solution was added to the organic solution in a drop wise fashion.

The flask was then immersed in a 75° C. oil bath. Stirring and heating under a positive argon pressure for 24-48 hours.

After analyzing the polymer with Gel Permeation Chromatography (GPC), 0.5 mL of phenylboronic acid 1,3-propanediol ester in 2 mL of toluene (previously degassed) was added. The reaction solution was kept in 75° C. for an additional hour. After that it was removed from heat and transferred to a nitrogen box.

Polymer Isolation

All solvents were degassed using argon. All glassware and tubes were dried and put into nitrogen purge box the night before isolation.

The warm polymer solution was dropwise added into 3 times of volume of acetone solution under rapid stirring. The solution was left still before the supernant was decanted away and the residue was transferred to centrifuge tubes while wrapped in aluminum foil. After centrifugation, the tubes were transferred into the nitrogen purge box to decant away the solvent. The isolated powder was transferred to a vial and re-dissolved in hot toluene (~0.5 g polymer used about 15-20 mL of toluene). Then to this solution 4 fold amount of amine-functionalized silica gel was added and stirred on a hot plate at 70-90° C. to keep the polymer in solution for 1 hour. The solution was filtered through a fluted filter paper. About 10-20 mL of hot toluene was used to wash the residue and aid the transfer. Acetone was added to this filtered polymer solution until it became cloudy. Then the solution was left to stand before the cloudy supernatant was decanted away from a gummy solid. Hot toluene was added to re-dissolve the gummy solid left in the previous flask and 4 times the volume of acetone solution was dropwise added to the solution. The polymer was collected by centrifugation, washed with pure acetone then centrifuged again and the acetone was decanted away. The washing step was repeated twice, after which the polymer pellet was dried in a glove box overnight. Weight (0.8 g) and Mw (50344 g/mol, PDI=2.61) were analyzed out the next day.

Molecular weight data were obtained using Perkin Elmer GPC Series 200 with UV/VIS Detector, Polymer Laboratories PLGel 5 mm column, chloroform with 3.75% IPA as elute or THF as elute and polystyrene standards as the calibration standards. $^1$H NMR spectra were measured on a Bruker 400 or Bruker Advance 500 spectrometers and referenced versus residual solvent shifts.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A polymer comprising structural unit of formula I:

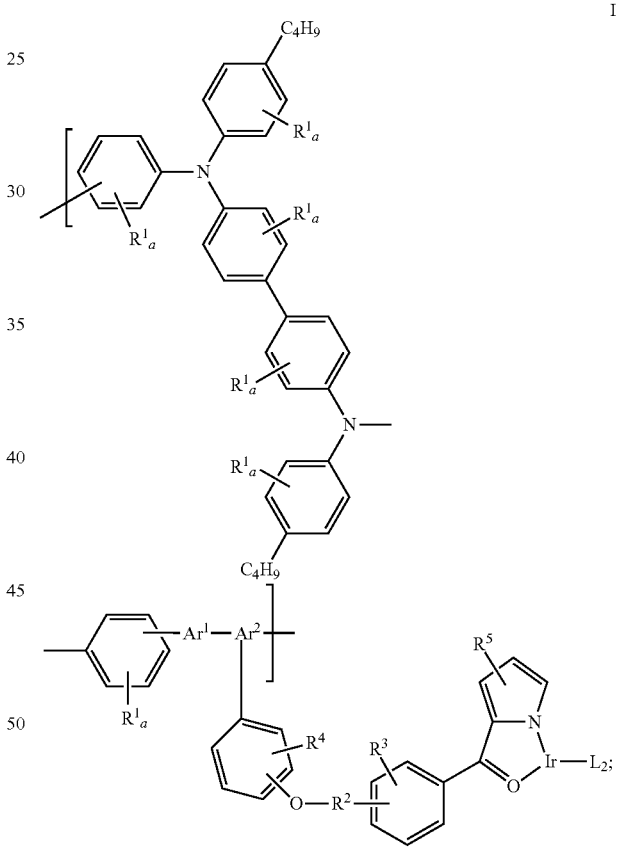

wherein
R$^1$ is, independently at each occurrence, a C$_1$-C$_{20}$ aliphatic radical, a C$_3$-C$_{20}$ aromatic radical, or a C$_3$-C$_{20}$ cycloaliphatic radical;
a is, independently at each occurrence, an integer ranging from 0-4;
Ar$^1$ is aryl or heteroaryl;
Ar$^2$ is fluorene;
R$^2$ is alkylene, substituted alkylene, oxaalkylene, CO, or CO$_2$;
R$^3$, R$^4$ and R$^5$ are independently hydrogen, alkyl, alkoxy, alkylaryl, aryl, arylalkyl, heteroaryl, substituted alkyl;

substituted alkoxy, substituted alkylaryl, substituted aryl, substituted arylalkyl, or substituted heteroaryl; and L is derived from phenylpyridine, tolylpyridine, benzothienylpyridine, phenylisoquinoline, dibenzoquinozaline, fluorenylpyridine, ketopyrrole, 2-(1-naphthyl)benzoxazole)), 2-phenylbenzoxazole, 2 phenylbenzothiazole, coumarin, thienylpyridine, phenylpyridine, benzothienylpyridine, 3 methoxy-2-phenylpyridine, thienylpyridine, phenylimine, vinylpyridine, pyridylnaphthalene, pyridylpyrrole, pyridylimidazole, phenylindole, or combinations thereof.

2. The polymer of claim 1, wherein $Ar^1$ is selected from

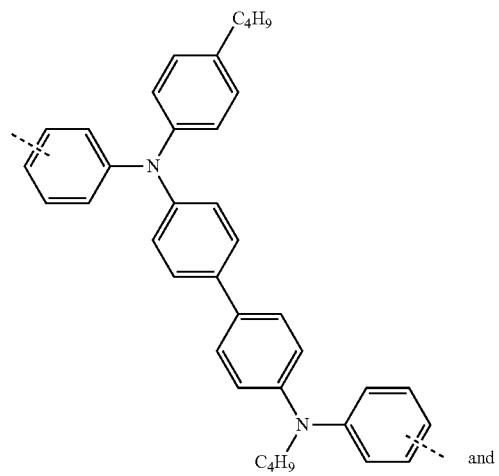

and

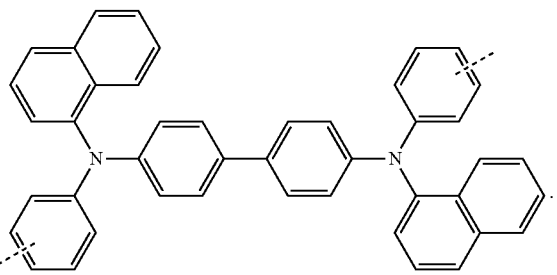

3. The polymer of claim 1, wherein $Ar^2$ derives from a dibromo 9,9-dioctyl fluorene monomer.

4. The polymer of claim 1, wherein L is derived from phenylisoquinoline.

5. The polymer of claim 1, comprising structural unit of formula II

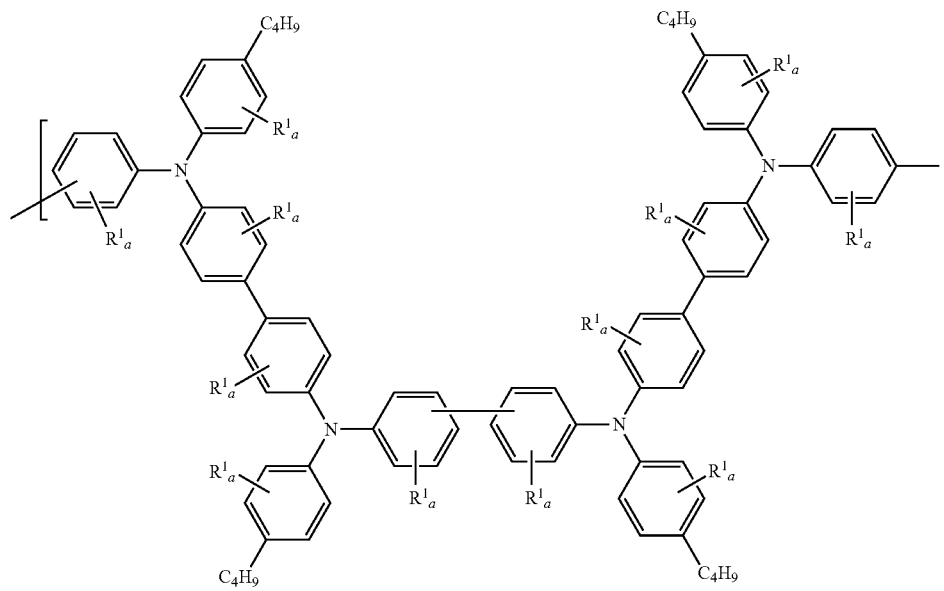

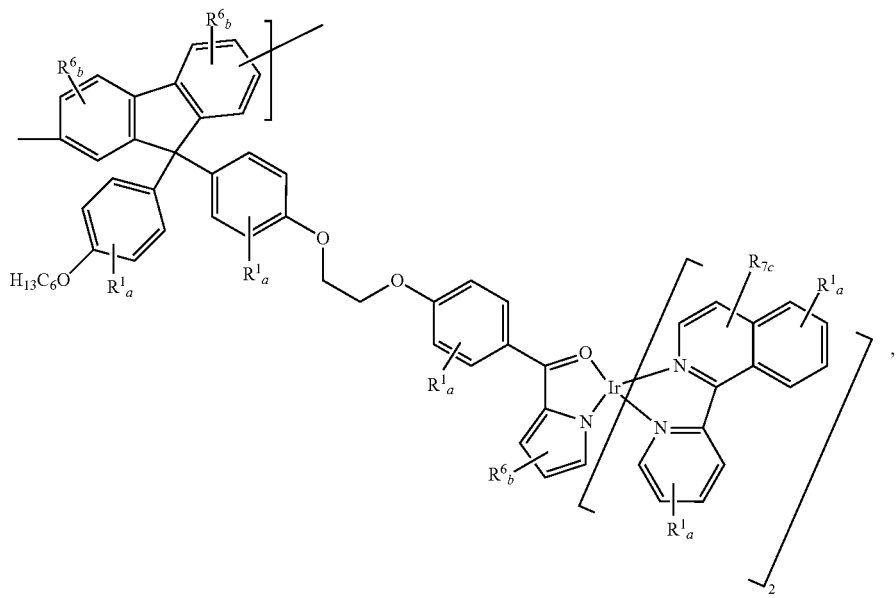
wherein
R⁶ and R⁷ are, independently at each occurrence, a $C_1$-$C_{20}$ aliphatic radical, a $C_3$-$C_{20}$ aromatic radical, or a $C_3$-$C_{20}$ cycloaliphatic radical;
b, independently at each occurrence, an integer ranging from 0-3; and
c, independently at each occurrence, an integer ranging from 0-2.
6. The polymer of claim 1, comprising structural unit of formula III
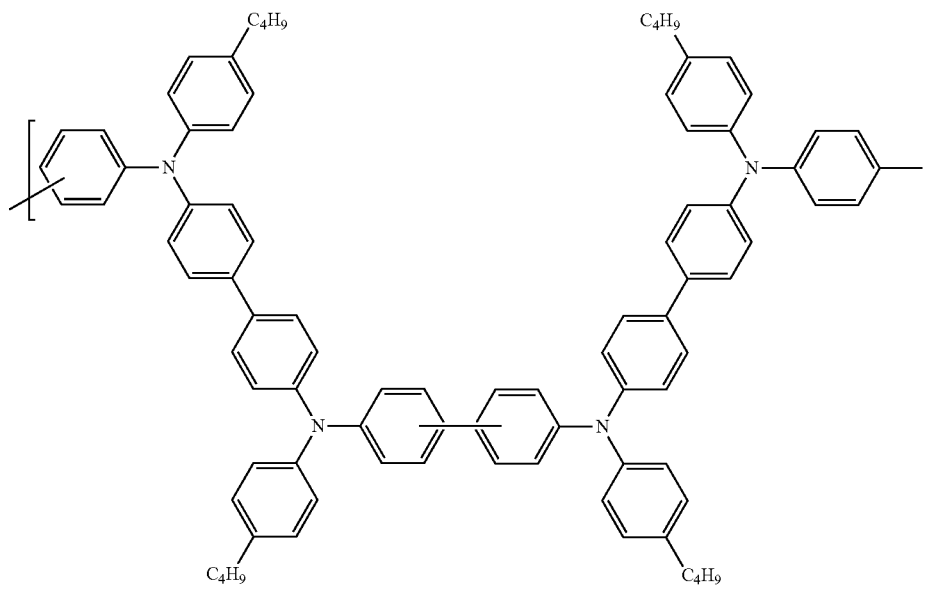

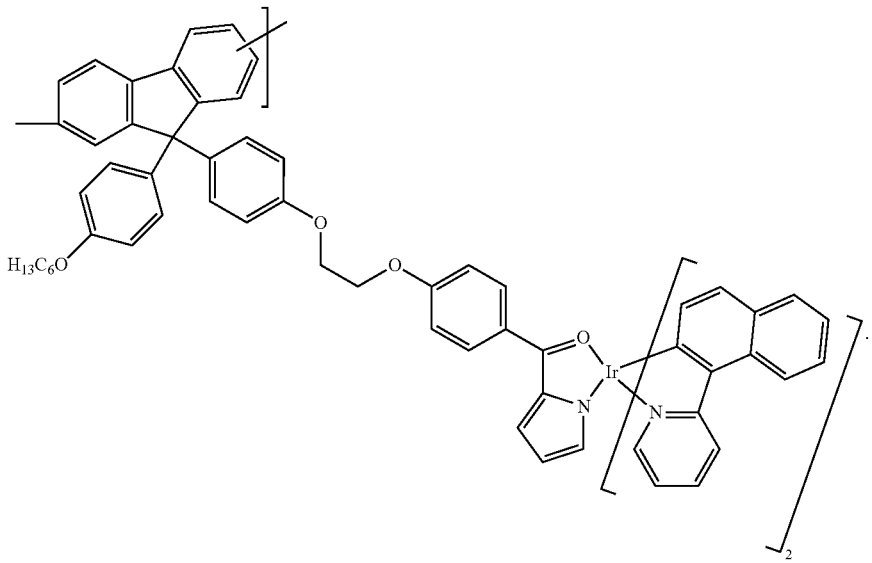
7. The polymer of claim 1, comprising structural unit of formula IV
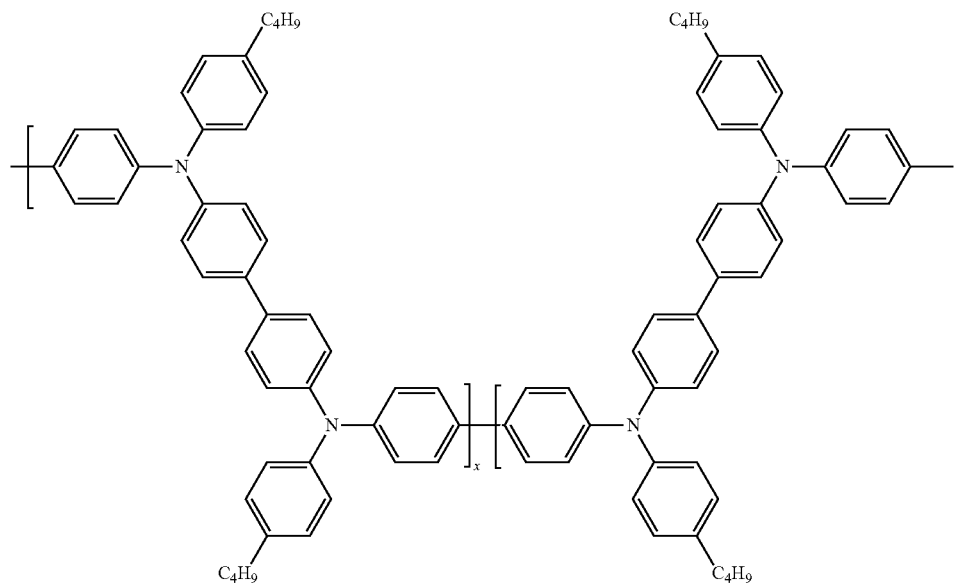

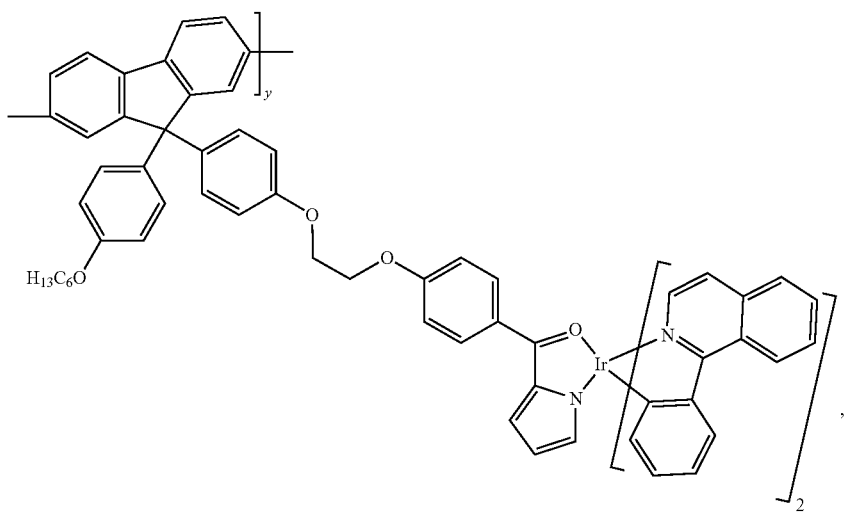
wherein x+y=100.
8. The polymer of claim 1, comprising structural unit derived from
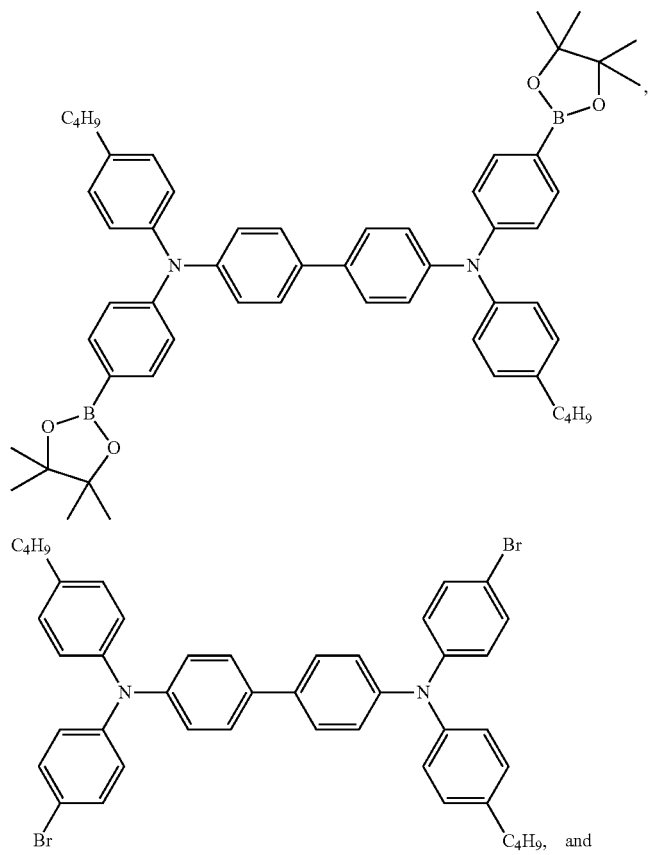

-continued
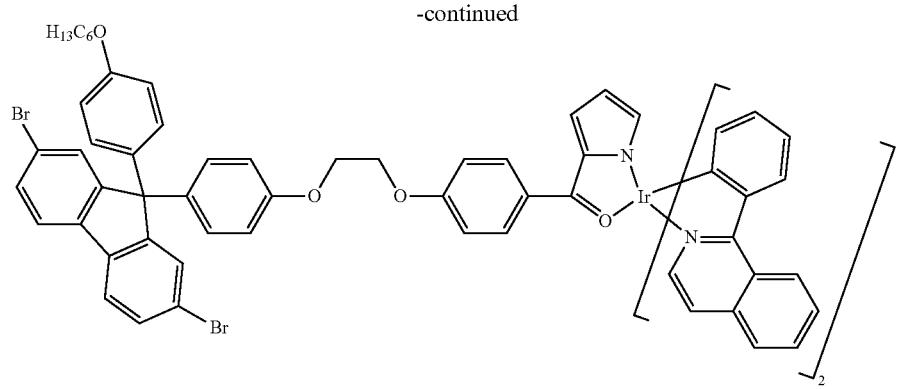
9. An optoelectronic device comprising a polymer of claim 1.
10. The optoelectronic device of claim 9, wherein the polymer comprises structural unit of formula II
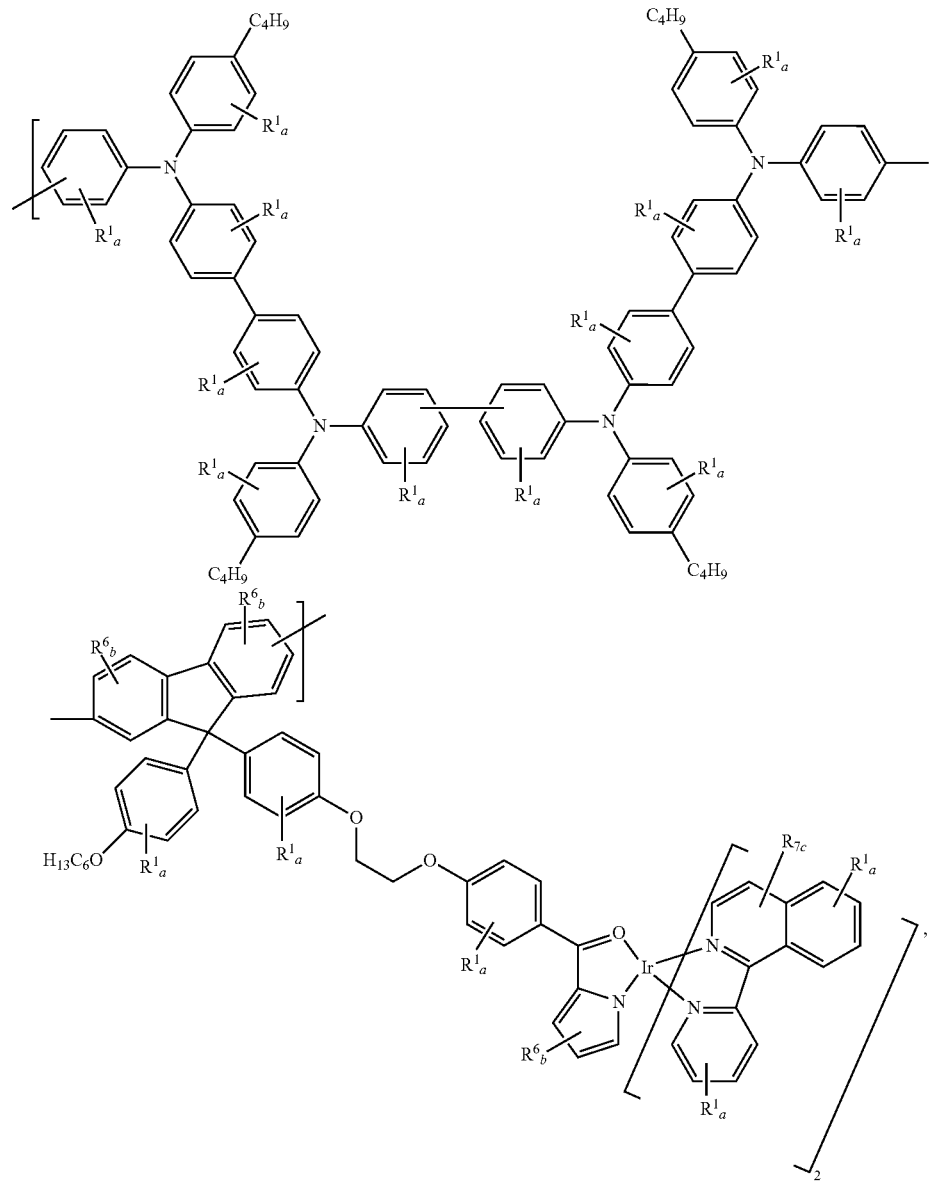

wherein
R⁶ and R⁷ are, independently at each occurrence, a $C_1$-$C_{20}$ aliphatic radical, a $C_3$-$C_{20}$ aromatic radical, or a $C_3$-$C_{20}$ cycloaliphatic radical;

b, independently at each occurrence, an integer ranging from 0-3; and c, independently at each occurrence, an integer ranging from 0-2.

11. The optoelectronic device of claim 9, wherein the polymer comprises structural unit of formula III

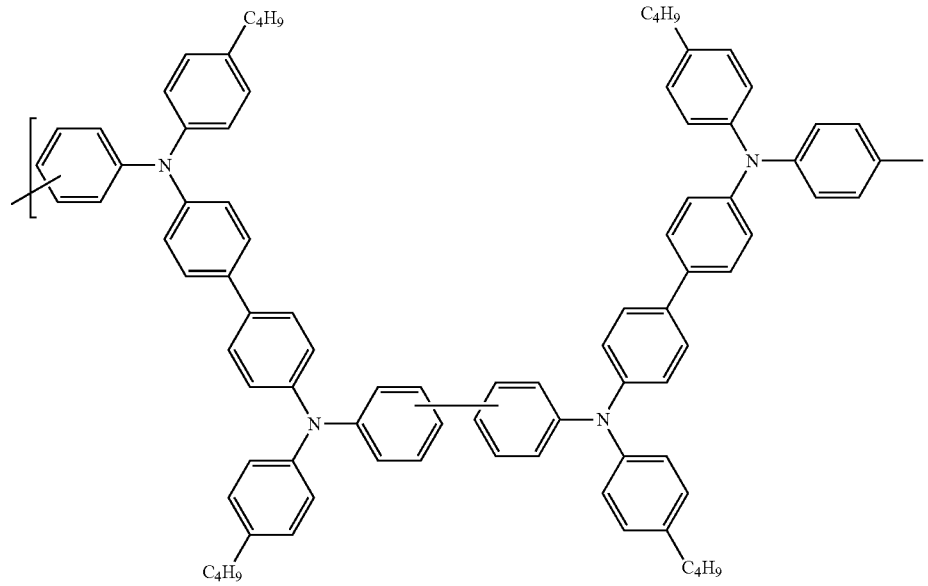

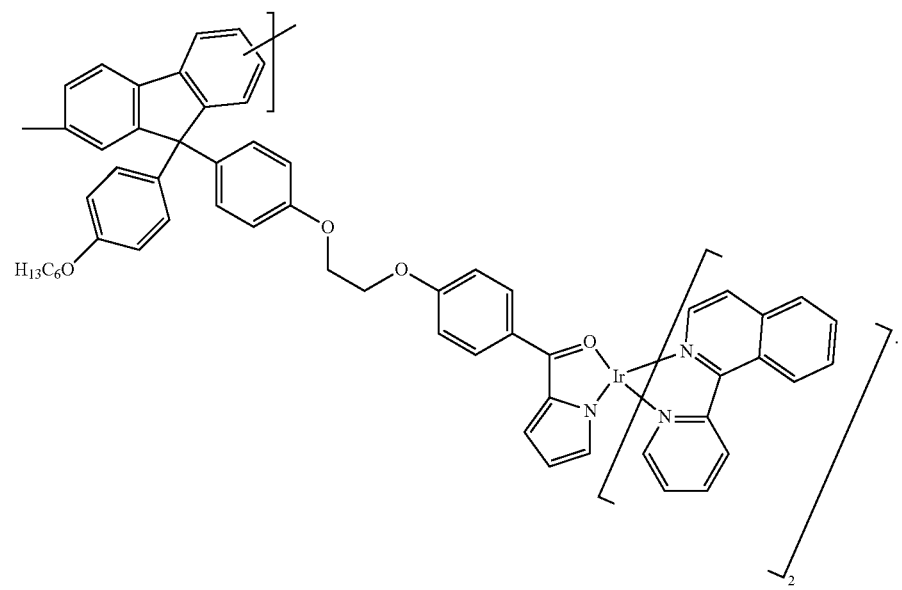

12. The optoelectronic device of claim 9, wherein the polymer comprises structural unit of formula IV
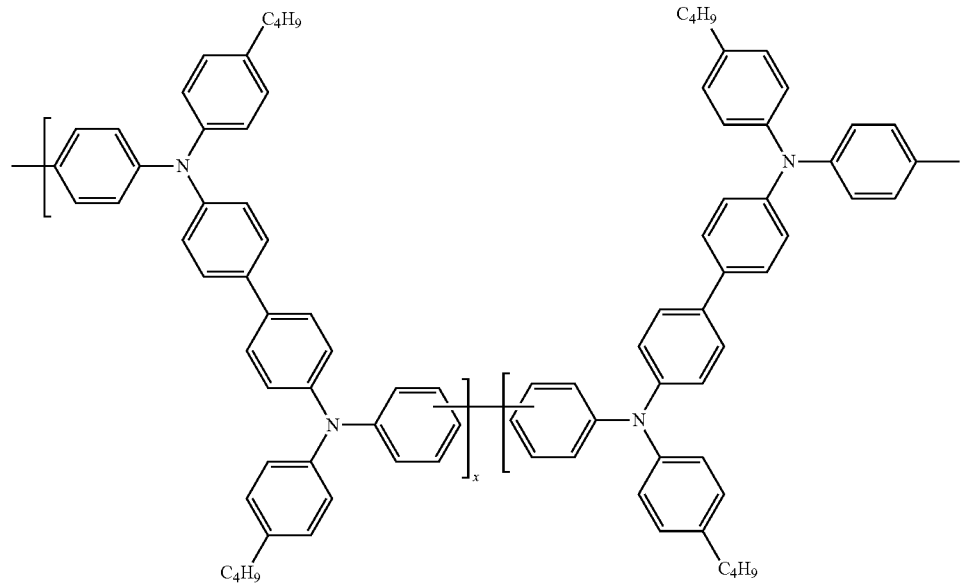
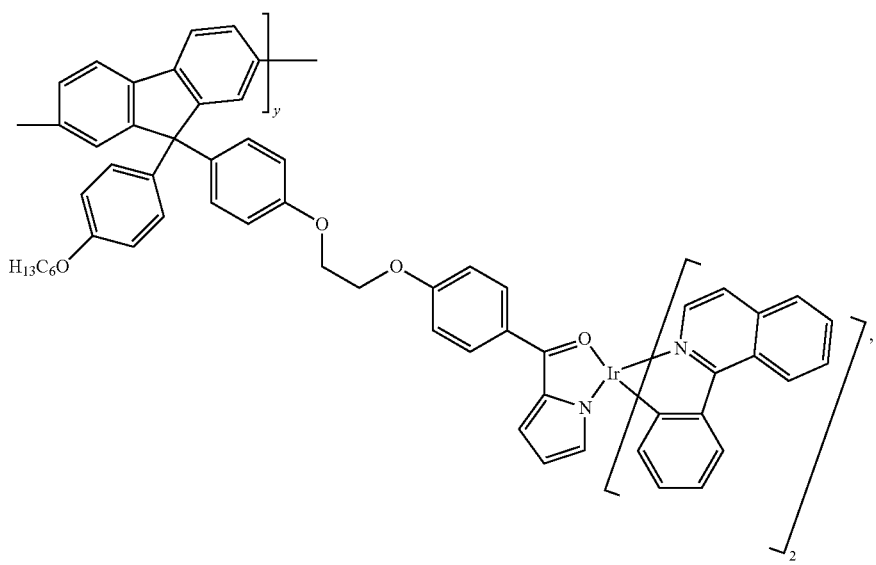
wherein x+y=100.
13. The optoelectronic device of claim 9, wherein the polymer comprises structural unit derived from

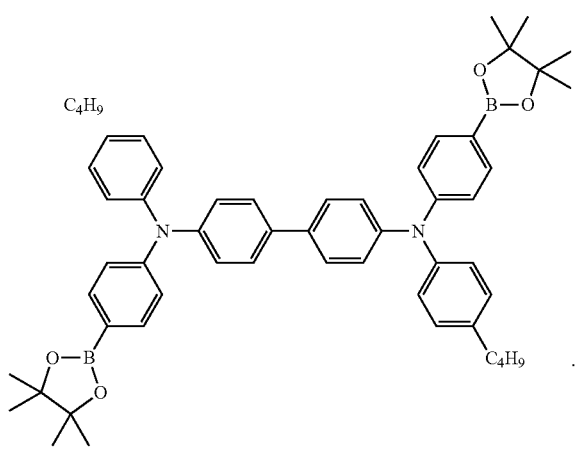
14. The optoelectronic device of claim 9, wherein the polymer comprises structural unit derived from
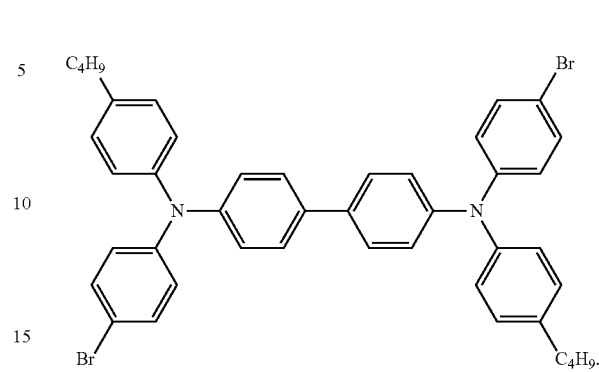
15. The optoelectronic device of claim 9, wherein the polymer comprises structural unit derived from
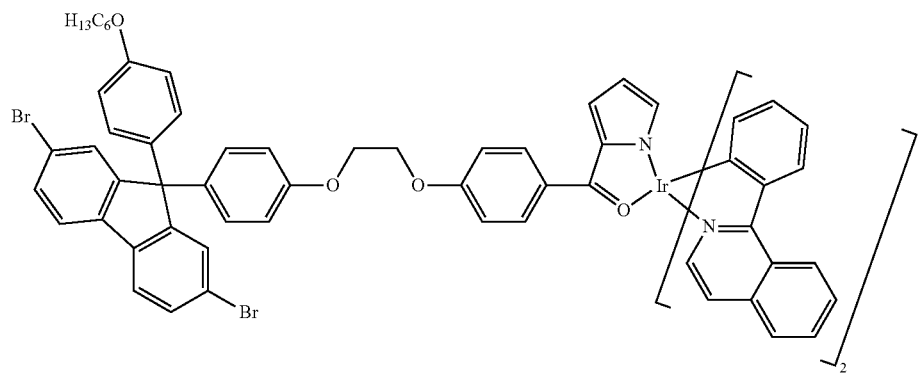
16. The optoelectronic device of claim 9, wherein the polymer comprises structural unit derived from
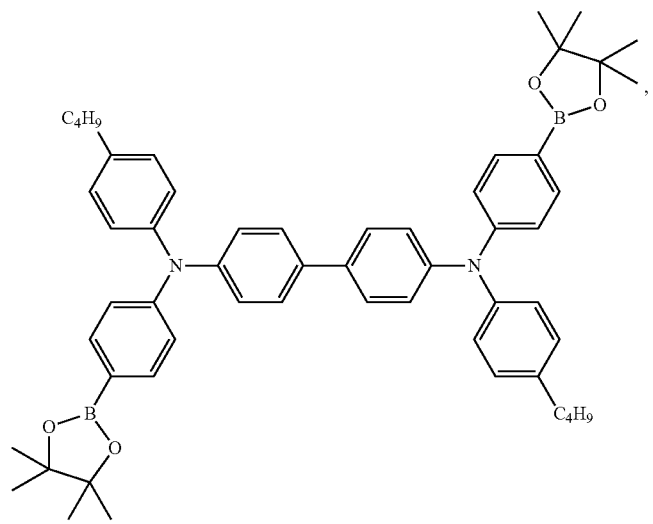

-continued

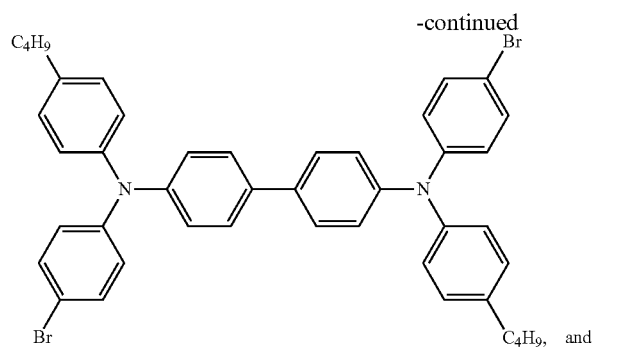

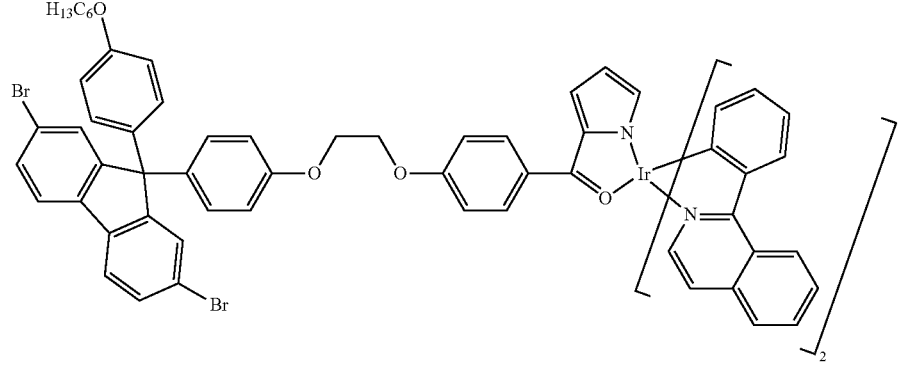

17. The optoelectronic device of claim 9, wherein $Ar^1$ is selected from

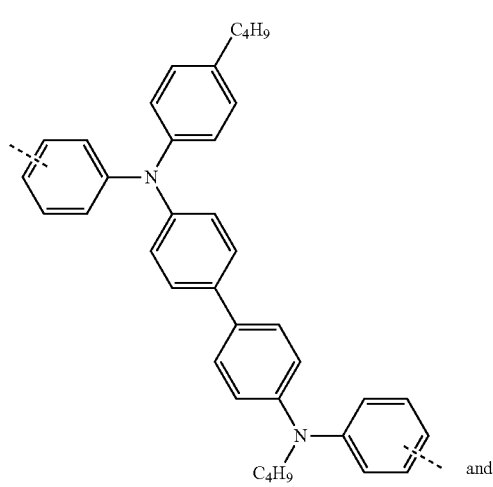

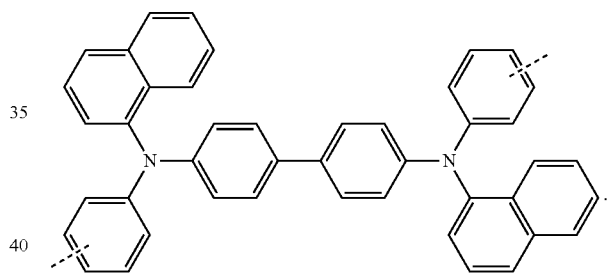

18. The optoelectronic device of claim 9, wherein $Ar^2$ derives from a dibromo 9,9-dioctyl fluorene monomer.

19. The optoelectronic device of claim 9, wherein L is derived from phenylisoquinoline.

20. The optoelectronic device of claim 9, comprising more than one light emissive layers and wherein at least one of the more than one light emissive layers comprises the polymer.

* * * * *

UNITED STATES PATENT AND TRADEMARK OFFICE
CERTIFICATE OF CORRECTION

PATENT NO. : 8,512,879 B2  
APPLICATION NO. : 12/615748  
DATED : August 20, 2013  
INVENTOR(S) : Ye et al.

Page 1 of 2

It is certified that error appears in the above-identified patent and that said Letters Patent is hereby corrected as shown below:

On the Title Page, in item (57), under "ABSTRACT", in Column 2, Lines 18-19, delete "2-(1-naphthyl) benzoxazole))," and insert -- 2-(1-naphthyl)benzoxazole, --, therefor.

In the Specification

In Column 2, Line 21, delete "2-(1-naphthyl)benzoxazole))," and insert -- 2-(1-naphthyl)benzoxazole, --, therefor.

In Column 3, Line 56, delete "2-(1-naphthyl)benzoxazole))," and insert -- 2-(1-naphthyl)benzoxazole, --, therefor.

In Column 17, Line 5, delete "6,023,371" and insert -- 6,023,371. --, therefor.

In Column 18, Line 67, delete "$H_2C_6H_{10}$-)," and insert -- $H_2NC_6H_{10}$-), --, therefor.

In Column 20, Line 39, delete "propyl," and insert -- i-propyl, --, therefor.

In Column 29, Line 21, delete "([(piq)$_2$Ir(7)]," and insert -- [(piq)$_2$Ir(7)], --, therefor.

In the Claims

In Column 35, Lines 5-6, in Claim 1, delete "2-(1-naphthyl)benzoxazole))," and insert -- 2-(1-naphthyl)benzoxazole, --, therefor.

In Columns 37-38, Line 1, in Claim 5, in Chemical Structure, delete " 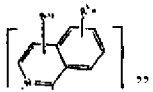 " and Signed and Sealed this  
Third Day of February, 2015

Michelle K. Lee  
*Deputy Director of the United States Patent and Trademark Office*

CERTIFICATE OF CORRECTION (continued)
U.S. Pat. No. 8,512,879 B2 insert -- 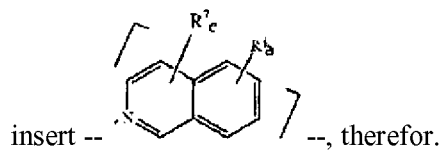 --, therefor.

In Columns 39-40, Line 1, Claim 6, in Chemical Structure, delete " 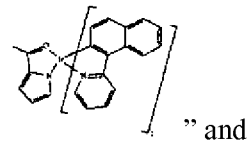 " and insert -- 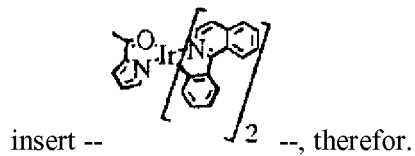 --, therefor.

In Columns 45-46, Line 6, in Claim 11, in Chemical Structure, delete " 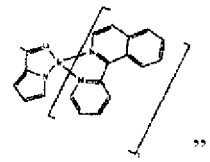 " and insert -- 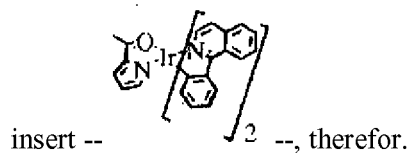 --, therefor.